(12) United States Patent
Gohardehi et al.

(10) Patent No.: US 12,288,520 B2
(45) Date of Patent: Apr. 29, 2025

(54) METHOD AND SYSTEM FOR CMOS-LIKE LOGIC GATES USING TFTS AND APPLICATIONS THEREFOR

(71) Applicants: Sheida Gohardehi, Waterloo (CA); Manoj Sachdev, Waterloo (CA); Qing Li, Cupertino, CA (US); William Wong, Waterloo (CA)

(72) Inventors: Sheida Gohardehi, Waterloo (CA); Manoj Sachdev, Waterloo (CA); Qing Li, Cupertino, CA (US); William Wong, Waterloo (CA)

( * ) Notice: Subject to any disclaimer, the term of this patent is extended or adjusted under 35 U.S.C. 154(b) by 0 days.

(21) Appl. No.: 18/281,516

(22) PCT Filed: Mar. 11, 2022

(86) PCT No.: PCT/CA2022/050364
§ 371 (c)(1),
(2) Date: Sep. 11, 2023

(87) PCT Pub. No.: WO2022/187969
PCT Pub. Date: Sep. 15, 2022

(65) Prior Publication Data
US 2024/0169913 A1    May 23, 2024

Related U.S. Application Data

(60) Provisional application No. 63/207,641, filed on Mar. 12, 2021, provisional application No. 63/211,751, filed on Jun. 17, 2021.

(51) Int. Cl.
G09G 3/3233    (2016.01)
H01L 29/786    (2006.01)

(52) U.S. Cl.
CPC ... *G09G 3/3233* (2013.01); *G09G 2300/0465* (2013.01); *G09G 2300/0852* (2013.01); *G09G 2310/0286* (2013.01); *G09G 2310/08* (2013.01); *G09G 2330/021* (2013.01); *H01L 29/78669* (2013.01)

(58) Field of Classification Search
CPC ......... G09G 3/3233; G09G 2300/0465; G09G 2300/0852; G09G 2310/0286; G09G 2310/08; G09G 2330/021; H01L 29/78669
See application file for complete search history.

(56) References Cited

U.S. PATENT DOCUMENTS

| | | | |
|---|---|---|---|
| 2011/0242140 A1* | 10/2011 | Lee ............ | G09G 3/3648 345/89 |
| 2012/0313903 A1* | 12/2012 | Pyon ........... | G09G 3/3275 345/82 |
| 2018/0152189 A1* | 5/2018 | Papadopoulos | H01L 27/1225 |
| 2019/0156764 A1* | 5/2019 | Kim ............ | G09G 3/2092 |
| 2020/0143728 A1* | 5/2020 | Lee ............. | G09G 3/20 |
| 2020/0184900 A1* | 6/2020 | Shin ........... | G09G 3/3233 |

\* cited by examiner

*Primary Examiner* — Premal R Patel

(57) ABSTRACT

The disclosure is directed at a CMOS-like logic gate including a set of thin-film transistors (TFTs), the set of TFTs including a subset of pull down TFTs, a subset of diode-connected TFTs and an output pull-up transistor; and a capacitor; wherein the subset of diode-connected TFTs, the output pull-up transistor and the capacitor are positioned to provide a bootstrapped feedback network to provide full-output swing; and wherein the subset of diode-connected TFTs and one of the subset of pull-down TFTs form a leakage current path; and wherein at least one of the subset of pull-down TFTs is connected to a first input.

13 Claims, 22 Drawing Sheets

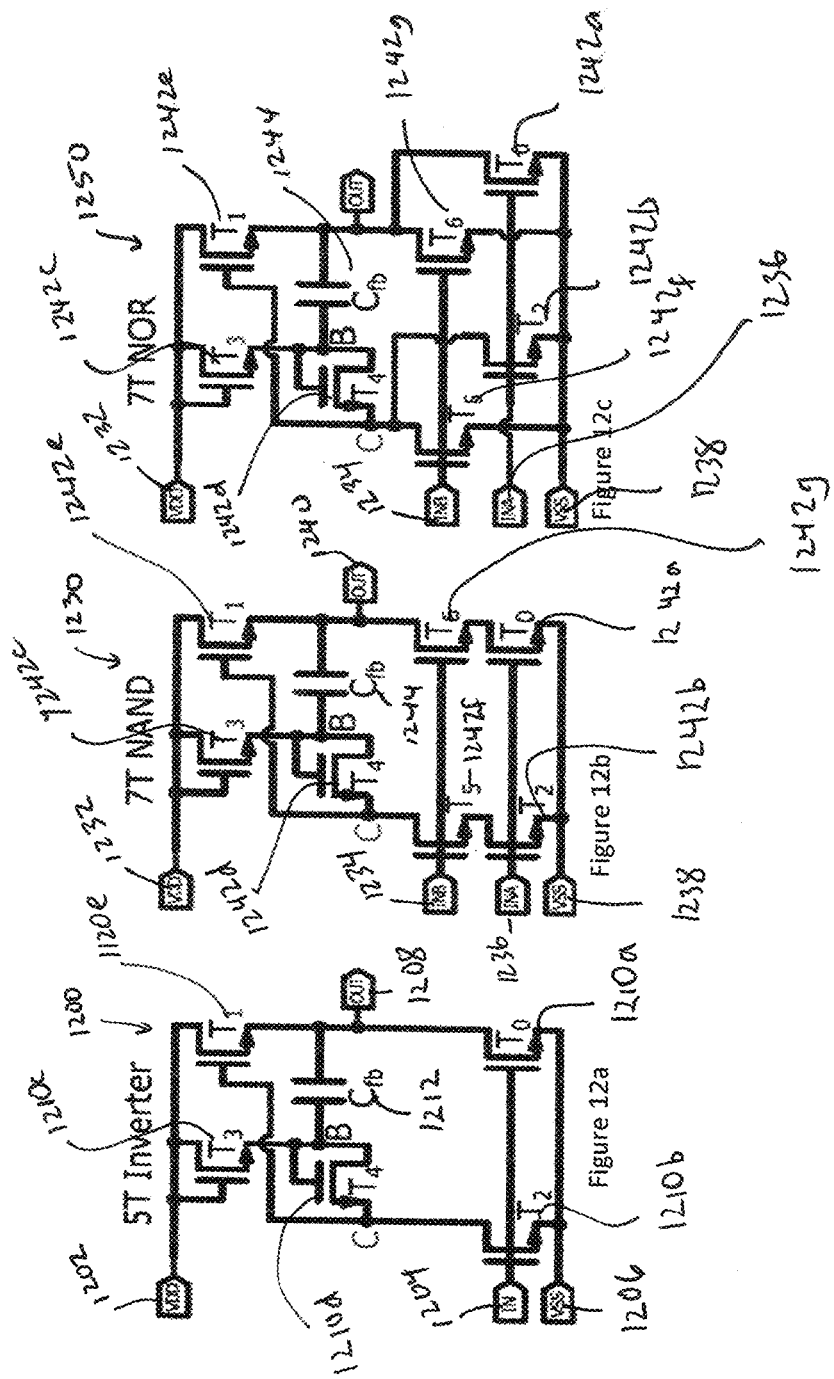

METHOD AND SYSTEM FOR CMOS-LIKE LOGIC GATES USING TFTS AND APPLICATIONS THEREFOR

CROSS-REFERENCE TO OTHER APPLICATIONS

The current disclosure claims priority from U.S. Provisional Application Nos. 63/207,641 filed Mar. 12, 2021 and 63/211,751 filed Jun. 17, 2021 both of which are hereby incorporated by reference.

FIELD

The present document relates to logic gates, and, in particular to a method and apparatus for CMOS-like logic gates with unipolar n-type Thin Film Transistors (TFTs).

BACKGROUND

In recent years, demand for cell phones, laptops, smartwatches, and head-mounted displays in Virtual Reality (VR) and Augmented Reality (AR), etc. have been grown rapidly. Since all these mentioned devices work with batteries, energy consumption is a feature that needs to be substantially improved. Understanding that the display panel consumes a significant portion of the overall energy consumption of these devices, it is beneficial to reduce the power and energy consumption of the display while maintaining display luminance level and quality of the image. Hence, new low-power driving methods are necessary to reduce the power consumption of display drivers.

Besides power consumption, resolution, refresh rate, and color depth are other features of a display that may be improved based on the display application and resources.

With fast growing interests in flexible displays, conformable on-body sensors, and Internet-of-Things (IoT) devices, the demand for low-thermal budget flexible electronics has been rising owing to its low-cost and high-volume fabrication capabilities. The realization of such technologies has the potential to enable a wide range of applications in medical, biological, environmental, and as well as consumer electronics. The suitability of amorphous silicon (a-Si:H), transition metal-oxide, and organic thin-film transistors (TFTs) have been demonstrated for realization of low-cost and large-area-fabrication capabilities to varying degrees of success.

However, being fundamentally different from crystalline-silicon CMOS technologies, disordered semiconductor TFTs are mostly unipolar, lacking the benefit of having a complementary transistor type. Therefore, it has always been challenging to realize complex logic circuits due to the low stage-to-stage gain and high static leakage-current. To overcome these problems, there were several attempts on improving fabrication techniques to have complementary transistors. However, the high production cost and complexity of these approaches have not resulted in distinct advantages. Consequently, the integration of various TFT-based logic circuits on the same substrate has not been technically competitive to CMOS.

Primary logic gates such as inverter, NAND, and NOR are the basic elements to realize any logic circuit. Conventionally, using n-type only unipolar technologies, an inverter is constructed with two TFTs. Such a configuration is not capable of providing full-swing output signals. When the input signal is high, both transistors are ON which results in an excessive direct path current, and the output voltage does not reach ground level. On the other hand, when the input signal is low, the maximum output voltage is only $V_{DD}$, with $V_t$ being the threshold-voltage of one of the transistors. Consequently, when a multi-stage circuit is implemented, logic swing is successively reduced resulting in loss of logic functionality after only a few stages. Therefore, there is provided a method and apparatus for CMOS-like logic gates with unipolar n-type TFTs.

SUMMARY

In one aspect of the disclosure, there is provided a CMOS-like logic gate including a set of thin-film-transistors (TFTs), the set of TFTs including a subset of pull-down TFTs, a subset of diode-connected TFTs and an output pull-up transistor; and a capacitor; wherein the subset of diode-connected TFTs, the output pull-up transistor and the capacitor are positioned to provide a bootstrapped feedback network to provide full-output swing; and wherein the subset of diode-connected TFTs and one of the subset of pull-down TFTs form a leakage current path; and wherein at least one of the subset of pull-down TFTs is connected to a first input.

In another aspect, a width of the pull-down TFT in the leakage current path is less than a width of the other TFTs in the set of TFTs to reduce static leakage current. In yet another aspect, the capacitor is positioned between the set of diode-connected TFTs and a signal output. In yet a further aspect, the subset of pull-down TFTs are connected to a signal input. In a further aspect, the subset of diode-connected TFTs is connected to a voltage input.

In yet another aspect, the logic gate further includes a NAND gate set of TFTs connected to a second input. In a further aspect, the NAND gate set of TFTs are located in series between the subset of diode-connected TFTs and the subset of pull-down TFTs. In an aspect, the logic gate further includes a NOR gate set of TFTs connected to a second input. In yet another aspect, the NOR gate set of TFTs are located in parallel with the subset of pull-down TFTs. In a further aspect, the other of the pull-down TFTs is connected to an output. In another aspect, the output pull-up TFT is connected to the output.

In another aspect of the disclosure, there is provided a flexible substrate for use in displays including a set of logic gates, each logic gate including a set of thin-film-transistors (TFTs), the set of TFTs including a subset of pull-down TFTs, a subset of diode-connected TFTs and an output pull-up transistor; and a capacitor; wherein the subset of diode-connected TFTs, the output pull-up transistor and the capacitor are positioned to provide a bootstrapped feedback network to provide full-output swing; and wherein the subset of diode-connected TFTs and one of the subset of pull-down TFTs form a leakage current path; wherein at least one of the subset of pull-down TFTs is connected to a first input; and wherein the subset of pull-down transistors are positioned to be parallel or perpendicular to a bending direction of the flexible substrate.

In another aspect, the flexible substrate further includes a set of metal layers, the set of metal layers including an via layer for internal routing within the set of logic gates, a horizontal interconnects layer and a vertical interconnects layer.

In another aspect of the disclosure, there is provided a display including an array of pixels positioned in a grid-like manner having a set of pixel rows and a set of pixel columns; a set of row drivers, each of the set of row drivers connected to one of the set of pixel rows; a set of shift registers and hold registers, each of the set of shift registers and each of the set of hold registers connected to one of the set of pixel columns; wherein a connection between each of the set of pixel columns and its associated hold register is via a pair of data lines.

In a further aspect, the display includes a set of pixel column electrical components located between each hold register and its associated pixel column. In another aspect, the display further includes a set of pixel row electrical components located between each row driver and its associated pixel row.

Embodiments herein provide logic gate designs with CMOS-like features. In one embodiment, the logic gates have 85% static leakage current reduction compared to conventional diode-configured designs. In another embodiment, the logic gates have a 20% smaller footprint compared to earlier circuit implementations.

DESCRIPTION OF THE FIGURES

Various aspects and features will become apparent, to those ordinarily skilled in the art, upon review of the following description of some exemplary embodiments and related Figures.

FIG. 3b is a timing diagram of a frame with unweighted pulse width modulation (PWM) with respect to the display of FIG. 3a;

FIG. 3c is a timing diagram of a frame with weighted PWM with respect to the display of FIG. 3a;

FIG. 4b is a timing diagram of a frame with unweighted pulse width modulation (PWM) with respect to the display of FIG. 4a;

FIG. 4c is a timing diagram of a frame with weighted PWM with respect to the display of FIG. 4a;

FIG. 5b is a timing diagram for the display of FIG. 5a;

FIG. 6b is a timing diagram for the display of FIG. 6a;

FIG. 7b is a timing diagram of a frame for the display of FIG. 7a;

FIG. 8b is a timing diagram of a frame for the display of FIG. 8a;

FIG. 9b is a timing diagram for a frame of the display of FIG. 9a;

FIG. 10b is a timing diagram of control and row signals for the display of FIG. 10a;

FIG. 11b is a timing diagram of control and row signals for the display of FIG. 11a;

FIG. 12a is a schematic diagram of a 5T inverter;

FIG. 12b is a schematic diagram of a 7T NAND gate;

FIG. 12c is a schematic diagram of a 7T NOR gate;

DETAILED DESCRIPTION

The following description with reference to the accompanying drawings is provided to assist in understanding the example embodiments as defined by the claims and their equivalents. The following description includes various specific details to assist in that understanding but these are to be regarded as merely examples. Accordingly, those of ordinary skill in the art will recognize that various changes and modifications of the embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used to enable a clear and consistent understanding. Accordingly, it should be apparent to those skilled in the art that the following description of embodiments is provided for illustration purposes only and not for the purpose of limiting the invention as defined by the appended claims and their equivalents.

The disclosure is directed at a method and system for CMOS-like logic gates with unipolar n-type Thin Film Transistors (TFTs). In one embodiment, the CMOS-like logic gates may be implemented or integrated into flexible substrates.

Figure 14:
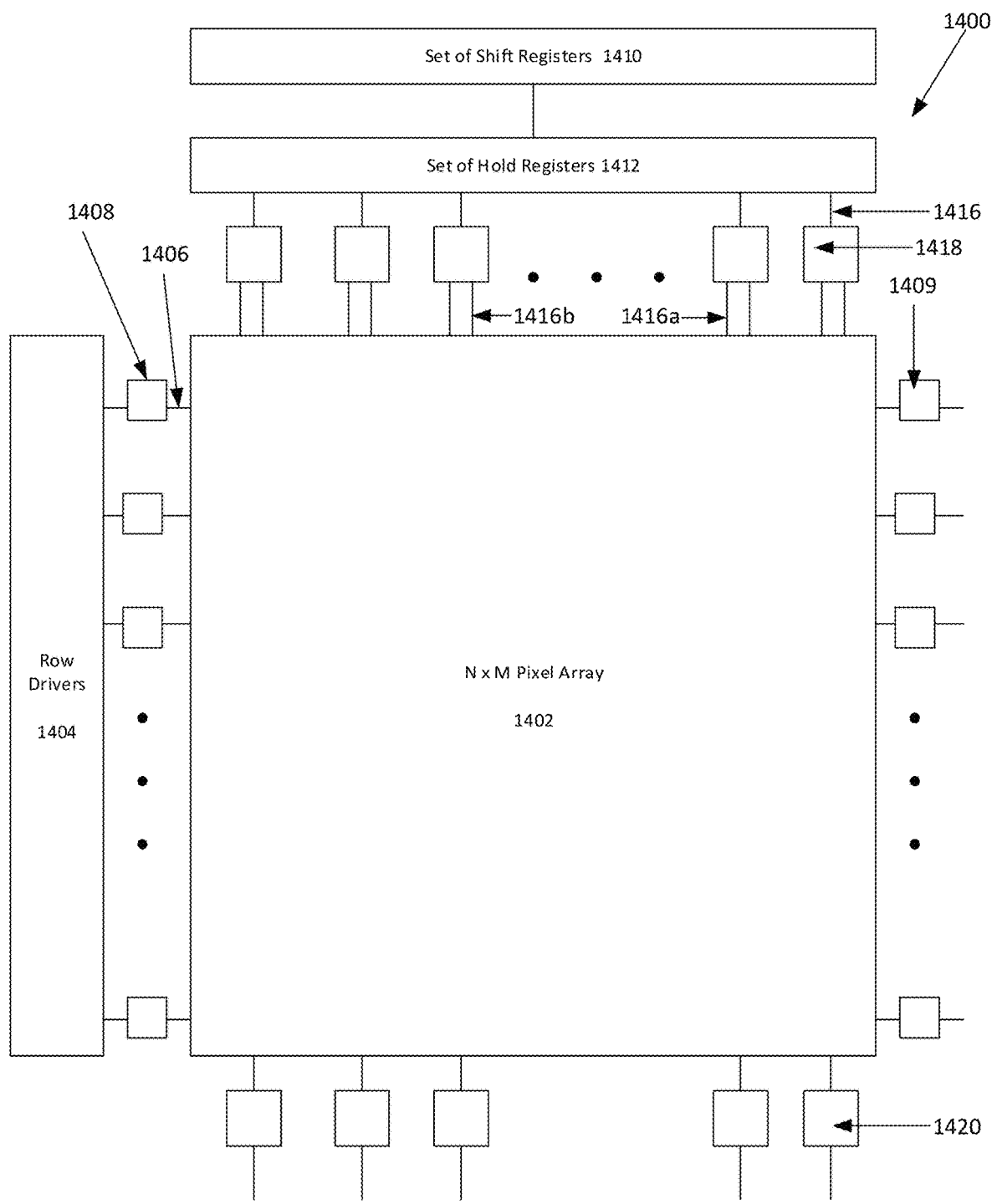
FIG. 14 is a schematic diagram of a general display architecture in accordance with the disclosure.

Turning to FIG. 14, a schematic diagram of an N*M active matrix display in accordance with the disclosure is shown. The active matrix display 1400 includes an array of individual pixels 1402 that are positioned in a grid-like manner in N rows and M columns. The design of the N×M array of pixels will be understood. In the current embodiment, there are N rows and M columns wherein a coordinate of each pixel may be represented by (row, column).

The display 1400 further includes a set of row drivers 1404 that control, or drive, each of the pixels 1402 in an individual pixel row via row driver control, or data, lines 1406. Although the set of row drivers are shown as a single box, or structure, in FIG. 14, it is understood that each row is associated with an individual row driver 1404. In some embodiments, each pixel row may include a first set of pixel row components 1408 between the row driver 1404 and the pixel row. In other embodiments, the display 1400 may also include a set of second set of pixel row electrical components 1409 at the end of each pixel row. In other embodiments, the first set and the second set of pixel row electrical components may be integrated together with both located between the row driver 1404 and the pixel row. Although not shown in FIG. 14, the ends of the pixel rows may be shorted together. This will be described in more detail with respect to the different embodiments taught below.

The display 1400 further includes a set of shift registers 1410 and a set of hold registers 1412 that provides data to the individual columns of pixels within the pixel array 1402. Connection between the hold registers 1412 and the pixel column is via pixel column data lines 1416. In some embodiments, a first set pixel column electrical components 1418 may be placed, integrated or implemented between the individual hold registers 1412 and its associated pixel column. Although only a single data line is shown between the hold registers 1412 and the first set pixel column electrical components 1418, it is understood that multiple data lines may be used for each pixel column. This will be seen in more detail with some of the embodiments discussed below. In some embodiments, each pixel column may include a second set of pixel column electrical components 1420 that may be connected via one or many data lines. Similar to above, while only a single data line is shown connected between the pixel column and the second set of pixel column electrical components 1420, there may be multiple data lines as will be understood and described below. In other embodiments, the first and second set of pixel column electrical components may be integrated together and located between the set of hold registers and each pixel column. Examples of electrical components that may form part of the first or second set of pixel row or pixel column electrical components include, but are not limited to, transistors, switches, demultiplexers, buffers, DAC, capacitors and the like.

As can be seen in FIG. 14, data input of each pixel column is controlled by a pair of data lines 1416, seen as a low data line 1416a and a high data line 1416b.

In one embodiment, the disclosure is directed at an N*M display that uses a multiple driver methodology for controlling the individual pixels within the display or pixel array 1402. In one embodiment, the disclosure divides the data bits (transferred from the shift 1410 and hold 1412 registers to the array of pixels 1402 within each pixel column) into smaller segments where each smaller segment, or sub-data segment, has a lower number of bits, however, when the smaller segments are combined or put together, the same dynamic range of data is provided to each pixel. By using multiple drivers with each pixel column, typically in a ratio of one driver for each sub-data segment, each sub-data segment participates in the light intensity separately and the summation of currents from those drivers produces the same amount of current that a conventional pixel circuit produces for that data.

Figure 1A:
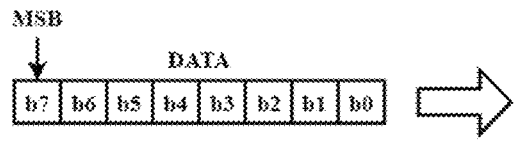
FIG. 1a is a schematic diagram of conventional pixel.
Figure 1A:
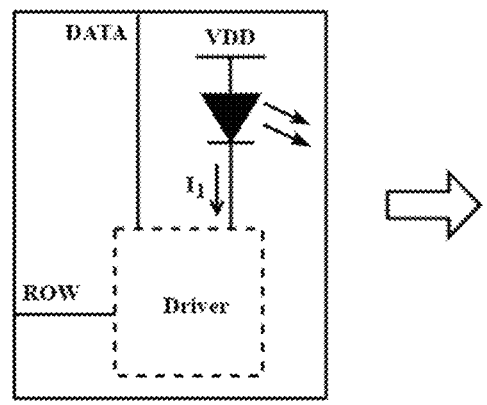
Figure 1B:
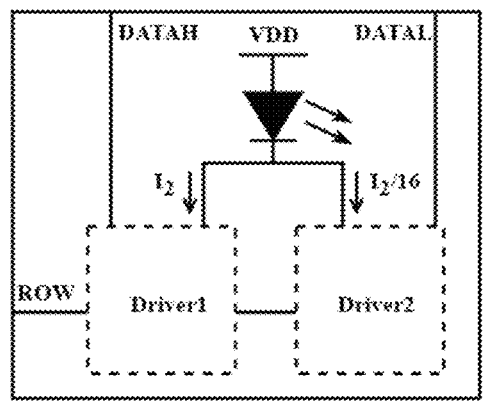
FIG. 1b is a schematic diagram of a pixel in accordance with an embodiment of the disclosure.

Turning to FIGS. 1a to 1d, a comparison between current single driver technology and a multiple driver methodology in accordance with the disclosure is schematically shown. Assuming a display with 8-bit color depth, by dividing the data into two 4-bit segments, or sub-data segments, (referenced as DATAH and DATAL), the light emitting diode (LED), or pixel, is driven separately for each part of data via two drivers (seen as Driver1 and Driver2 in FIG. 1b). As illustrated in FIG. 1b, the current provided by Driver2 is approximately 16 times smaller than the current provided by Driver1 since the four (4) bits that are driven by Driver2 are the less significant bits of the 8-bit data. In one embodiment, the drivers may be designed such that:

$$I_1 = I_2 + \frac{I_2}{16} \quad \text{Eq. 1}$$

where $I_1$ represents the overall current (as shown in FIG. 1a) and $I_2$ is the current driving Driver1 (as shown in FIG. 1b).

In the following, DATAH refers to the piece of data and the data column which corresponds to more significant bits and DATAL refers to the piece of data and the data column which corresponds to the less significant bits. If the number of data segments increases to more than two, then the number of drivers required to drive the LED increases accordingly, preferably in a one-to-one ratio. While increasing the number of sub-data segments may reduce the clock frequency and dynamic power consumption, the complexity, and area of the pixel circuit, or pixel array may be increased. Therefore, for each embodiment, there may be a desired or optimum number of data segments in order to reduce the dynamic power consumption while maintaining a footprint of the area of the pixel array and complexity of the pixel array within acceptable ranges.

Figure 1C:
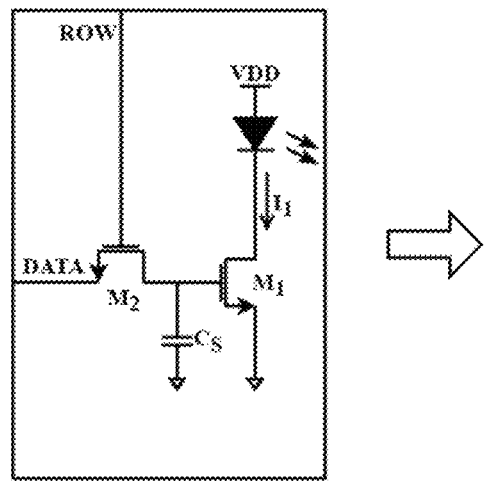
FIG. 1c is a schematic diagram of a conventional 2T1C pixel circuit.
Figure 1D:
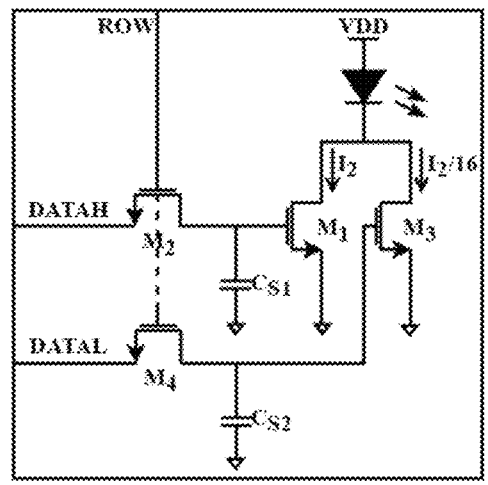
FIG. 1d is a schematic diagram of a dual driver pixel circuit in accordance with an embodiment of the disclosure.

Turning to FIGS. 1c and 1d, a conventional 2T1C pixel circuit that is used in a conventional, or prior art, driving scheme (FIG. 1c) and a dual driver pixel circuit in accordance with the disclosure (FIG. 1d) are respectively shown.

In FIG. 1c, the driver transistor ($M_1$) is an NMOS transistor and the LED is connected between $V_{dd}$ and the drain of $M_1$ transistor. It is noted that other conventional 2T1C architectures using PMOS technology as the driving transistor with the LED connected to the drain or source are also contemplated. As discussed above, the current which corresponds to the less significant data segment should be about 16 times smaller than the other current which corresponds to the more significant data segment due to the fact that this part of the data should contribute to a lower intensity of emission.

In order to design the display for this purpose, there are at least three different options.

A first option is to select a width and length of $M_1$ and $M_3$ such that:

$$I_{d3} = \frac{I_{d1}}{16} \qquad \text{Eq. 2}$$

where $I_{d3}$ is the current running through transistor $M_3$ and $I_{d1}$ is the current running through transistor $M_1$.

A second option, or method, is to select the threshold voltages of the transistors $M_1$ and $M_3$ to create the desired difference in current.

The third option is to use two different voltage levels as the maximum, or highest, voltage to store in the storage capacitors. Any of these options (or other ones not discussed) may be used to design the pixel array.

Figure 2A:
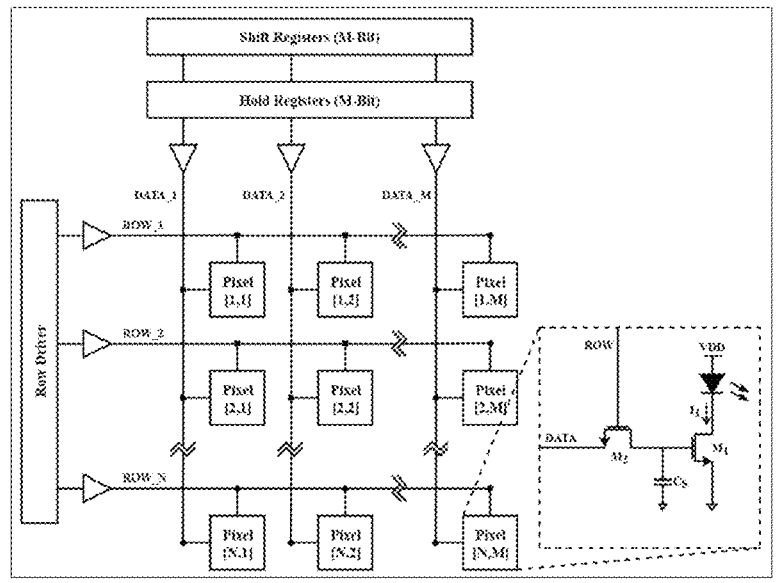
FIG. 2a is a schematic diagram of a conventional N*M active matrix display.

Turning to FIG. 2a, a prior art pixel circuit and drivers for an active matrix display with N rows and M columns is shown. The pixel circuit and drivers are used to implement a digital driving method using a single driver.

In this prior art embodiment, a size of the shift and hold registers is equal to the number of pixel column to accommodate to the required programming time, time period, or cycle where the pixels in a row will be programmed. The pixel circuit may be seen as a conventional 2T1C architecture where the driving transistor is assumed to be NMOS and the LED is connected between $V_{dd}$ and the drain of driving transistor. In general, there are two common digital driving procedures or methodologies that are used, unweighted PWM and weighted PWM.

Figure 2B:
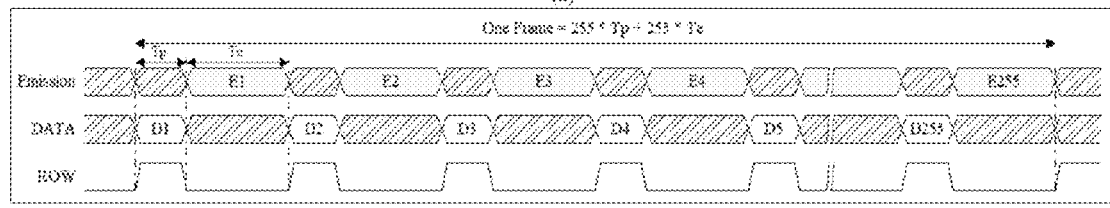
FIG. 2b is a timing diagram of a frame with unweighted pulse width modulation (PWM)

In the unweighted PWM digital driving method with a single driver, assuming a color depth of 8 bits, there are 255 sub-frames (i.e. programming and emission times for pixels in a row) during each frame time (such as shown in FIG. 2b). For example, if the greyscale for a pixel is 50 in a frame, during 50 out of 255 programming times, a logical 1 is stored in the storage capacitor of the pixel circuit while the rest of the 205 programming sub-frames, a logical 0 is stored. As shown in FIG. 2b, D1 to D255 represent the DATA value for each sub-frame that could be logical 1 or 0 based on the total greyscale. The access transistor for each pixel is turned on and off 255 times during each frame and the emission time is equal after all programming times.

Figure 2C:
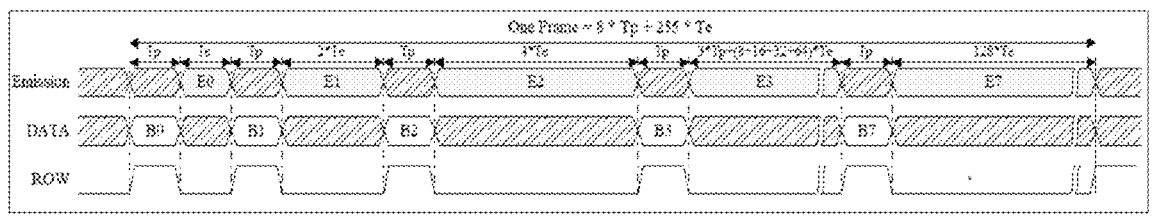
FIG. 2c is a timing diagram of a frame with weighted PWM.

Using the weighted PWM methodology requires eight (8) programming times for a color depth of 8 bits. In the weighted PWM method, the emission times are different based on the weight of the bit in the binary representation of the greyscale. This is shown in more detail in FIG. 2c.

Assuming $B_0$ as the least significant bit (LSB), the emission time for $B_0$ is equal to $2^0$. $T_e = T_e$. The emission time for the next bit, B1, is double, and so on where $T_e$ represents the smallest emission time in a frame. Therefore, for the most significant bit (MSB), the emission time is $2^7$ where $T_e = 128 T_e$. During the programming times, the LEDs are not emitting light, therefore, to have better, or improved, image quality, a method with less programming time is used. Moreover, the number, or value, of $T_p$ (i.e., the programming time) increases exponentially with color depth in the unweighted PWM method.

Because the weighted PWM method needs less programming times ($8T_p$ instead of $255T_p$), it is more commonly used. Equations 3 and 4 are used to calculate the programming time for the unweighted and weighted PWM driving methods, respectively. In these equations $T_p$ is the programming time, $T_e$ is the emission time, RR is the refresh rate, and n is the color depth of the design.

$$T_{p\_UW} = \frac{1}{RR*(2^n-1)*\left(1+\frac{T_e}{T_p}\right)} \qquad \text{Eq. 3}$$

$$T_{p\_W} = \frac{1}{RR*\left(n+(2^n-1)*\frac{T_e}{T_p}\right)} \qquad \text{Eq. 4}$$

In both unweighted and weighted PWM methods, during the emission time of the first pixel row, the row driver should scan the rest of rows once, and program all of them with corresponding data. Therefore, the emission time should be longer than the time required to program the rest of the display (as shown in Equation 5):

$$T_e \geq (N-1)T_p \qquad \text{Eq. 5}$$

where N is the number of rows in the display. Considering the minimum, or lowest, feasible emission time from Equation 5, Equations 3 and 4 may be re-written as Equations 6 and 7, respectively:

$$T_{p\_UW} = \frac{1}{RR*(2^n-1)*N} \qquad \text{Eq. 6}$$

$$T_{p\_W} = \frac{1}{RR*(n+(2^n-1)*(N-1))} \qquad \text{Eq. 7}$$

Equations 6 and 7 represent the maximum, or high, available programming time for each driving method based on the refresh rate, color depth, and number of rows. The amount of time available for programming each row ($T_p$), determines the data and row drivers' frequency. Since these times are proportional to each other, $T_p$ is a good indicator of the frequency of display's drivers in general. These equations will be used as a baseline to compare with the programming time of the dual driver methodology of the current disclosure.

Figure 3A:
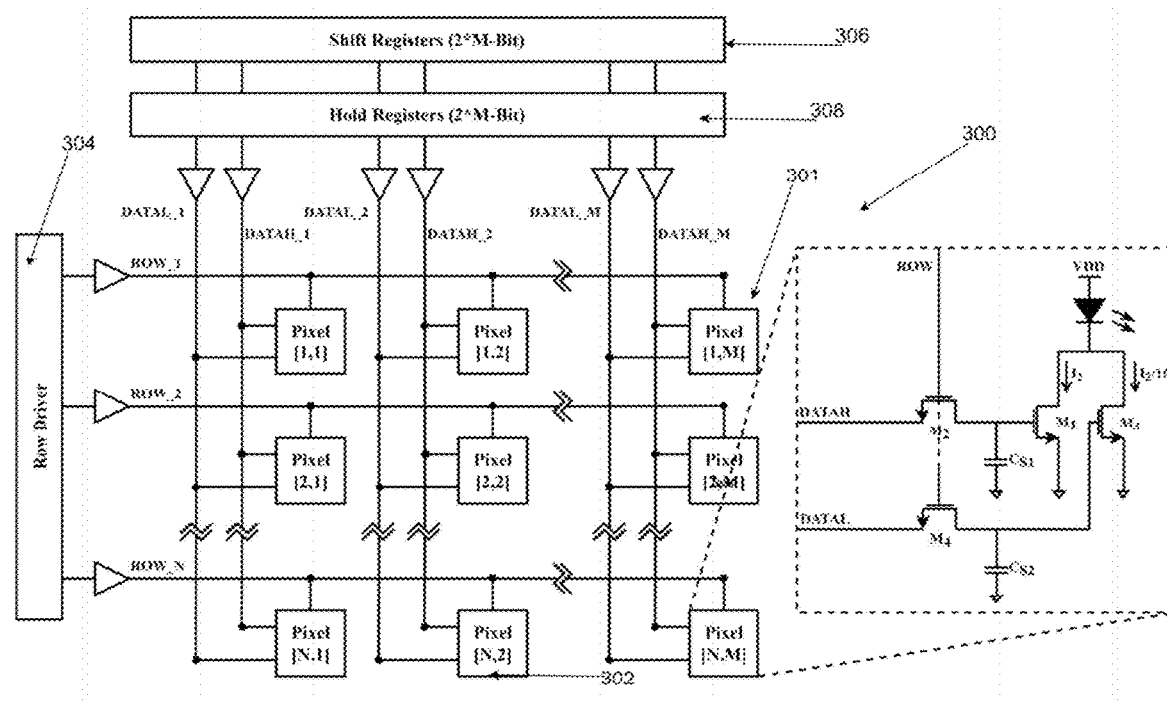
FIG. 3a is a schematic diagram of a N*M active matrix display in accordance with the disclosure.

Turning to FIG. 3a, an N*M active matrix display implemented with a digital multiple driver driving methodology is shown. As with FIG. 14, the N*M active matrix display 300 includes an array 301 of individual pixels 302 that are positioned in a grid-like manner in rows and columns. In the current embodiment, there are N rows and M columns wherein a coordinate of each pixel may be represented by (row, column). The display 300 further includes a set of row drivers 304 with each of the set of row drivers controlling a row of pixels. A set of shift 306 and hold 308 registers provide data to the pixel columns such as discussed above. Between the shift 306 and hold 308 registers and the pixel columns are a pair of buffers 310 where the pair of buffers may be seen as the first set pixel column electrical components. In the current embodiment, individual data lines from the hold registers 308 are connected to the individual buffers. An expanded view of a pixel is schematically shown in the inset of FIG. 3a.

As outlined above, the data being transmitted via the shift and hold registers may be split into two parts with two individual data lines for each pixel column. While the current embodiment shows only two data lines indicating the data being split into two parts, it is understood that the data may be split into a different number of parts, with the number of data lines equaling the number of parts.

In the current embodiment, each pixel column is connected to two data lines, or data wires, providing DATAH and DATAL to each pixel in a column. The size of each shift 306 and hold register 308 is twice compared to the size of each shift and/or hold register in the prior art N*M display implementation of FIG. 2a since for each programming time, two sets of data should be simultaneously available to feed into two storage capacitors (seen as $C_{s1}$ and $C_{s2}$ in the inset of FIG. 3a) associated with each pixel.

Figure 3B:
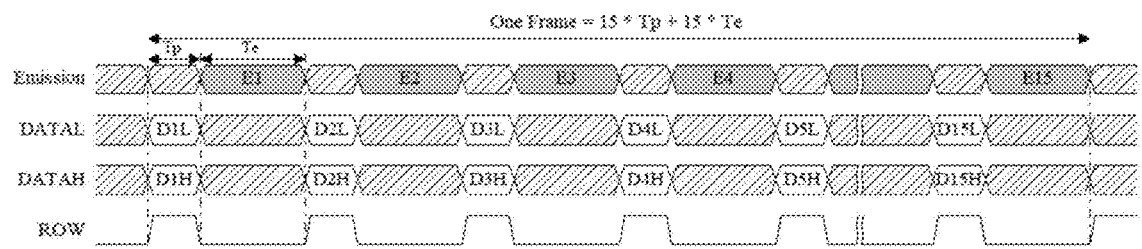

For the case of an unweighted PWM dual driver driving method with a color depth of 8 bits, the number of sub-frames is reduced from 255 (as shown in the time frame of the conventional display in FIG. 2b) to 15 (as shown in the time frame of FIG. 3b which relates to the display of FIG. 3a). As shown in FIG. 3b, during each programming time, two pieces, or sub-segments, of data (i.e. DATAH and DATAL) are programmed and the emission time after that represents the light intensity for the combination of those two pieces of data.

For example, assuming that the greyscale level is 122 out of 0 to 255 levels, the binary representation for this grey level is "0111, 1010". After splitting the data, the one part, or the first part, is "0111" which is the level of 7 in 0 to 15 scales and the second part is "1010" which is the level of 10 in 0 to 15 scales. Therefore, during the existing 15 programming times of a time frame, DATAH stores logical 1 on the $C_{S1}$ for 7 programming time slots and logical 0 for the rest. Similarly, DATAL stores logical 1 on the $C_{S2}$ for 10 programming time slots and logical zero for the rest of programming time slots.

As a result, in the first seven emission times, the current through the LED is equal to:

$$I_{LED} = I_2 + \frac{I_2}{16} \quad \text{Eq. 8}$$

and for the next three emission times (8 to 10), the current is:

$$I_{LED} = \frac{I_2}{16} \quad \text{Eq. 9}$$

and for the other five (5) emission times (11 to 15), the current is zero.

Figure 3C:
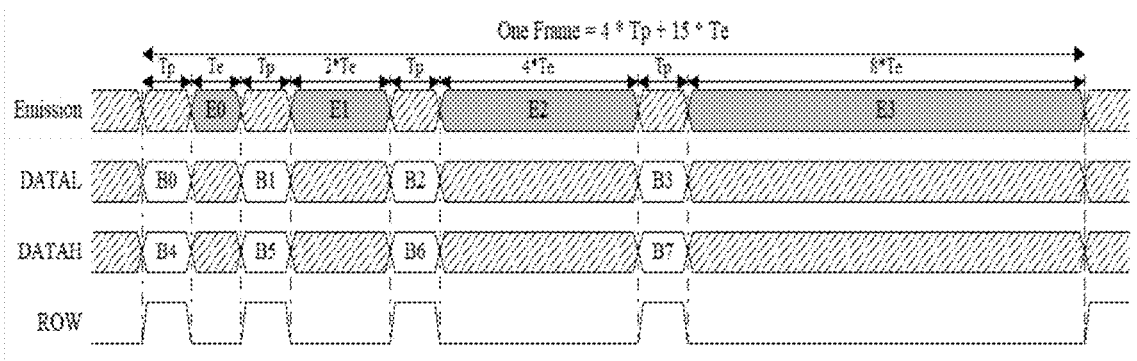

FIG. 3c illustrates a waveform for a weighted PWM dual driving method sing the display of FIG. 3a. In FIG. 3c, instead of 8 sub-frames (which is the typical waveform for the display conventional display as shown FIG. 2c), there are 4 sub-frames or sets of programming and emission times.

In the first programming time, the B0 and B4 logical values (e.g. B0=0 and B4=1 for the binary data of "0111, 1010") are stored in the $C_{S2}$ and $C_{S1}$ storage capacitors, respectively. Then in the next programming time, data corresponding to B1 and B5 is transferred to the column of pixels, and so on. As a result, in the first emission time ($E_0$), the current through the LED is equal to $I_2$, and for the second emission time ($E_1$) the current may be represented by Equation 8.

It can be seen that both PWM methods require slower clock frequency to operate a display with the same characteristics (such as color depth, resolution, and refresh rate) when using the dual-driver methodology. While applying this methodology increases the area of the pixel circuit, the methodology also lowers the dynamic power consumption significantly which is an advantage over current solutions. In another embodiment, the color depth, resolution, or frame rate of the display with the same clock frequency can be increased. Equations 10 and 11 illustrate the calculation of the programming time for the two PWM methods using the dual driver methodology. As can be seen, the available programming time is more, or higher, and as a result, the clock frequency of the display can be reduced substantially, since two pieces of data are handled in parallel.

$$T_{p\_UW-prop} = \frac{1}{RR*(2^{\frac{n}{2}}-1)*N} \quad \text{Eq. 10}$$

$$T_{p\_W-prop} = \frac{1}{RR*\left(\frac{n}{2}+(2^{\frac{n}{2}}-1)*(N-1)\right)} \quad \text{Eq. 11}$$

To compare the available programming times of the displays of the disclosure with conventional displays, Equations 6 and 7 may be used to evaluate the approximate reduction in the clock frequency of data and row drivers which provide for Equations 12 and 13.

$$\frac{T_{p\_UW-prop}}{T_{p\_UW}} = \frac{2^n-1}{2^{\frac{n}{2}}-1} \cong 2^{\frac{n}{2}} \quad \text{Eq. 12}$$

$$\frac{T_{p\_W-prop}}{T_{p\_W}} = \frac{n+(2^n-1)*(N-1)}{\frac{n}{2}+(2^{\frac{n}{2}}-1)*(N-1)} \cong 2^{\frac{n}{2}} \quad \text{Eq. 13}$$

From Equations 12 and 13, the driver's frequency of the disclosure is approximately $2^{(n/2)}$ times slower than conventional methods where n is the color depth. As a result of this reduction in clock frequency, the power consumption reduces significantly.

As the embodiment of FIG. 3a may require twice the number of shift and hold registers for each pixel column data line, which may lead to reduced overall power saving. In another embodiment, time multiplexing may be implemented to further improve power saving. This display embodiment is schematically shown in FIG. 4a where the size of the registers may be increased to be identical to registers of conventional displays and the clock frequency of the shift and hold registers doubled compared to the display architecture of FIG. 3a.

Figure 4A:
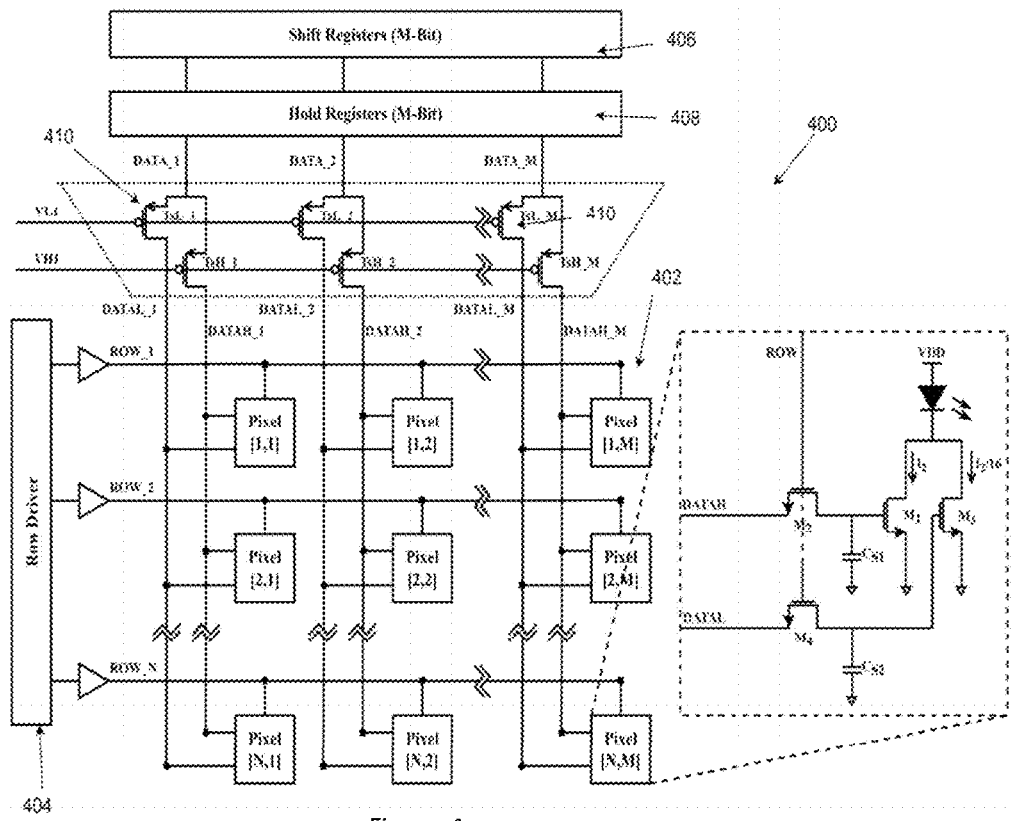
FIG. 4a is a schematic diagram of another embodiment of a N*M active matrix display in accordance of the disclosure.

As shown in FIG. 4a, the display architecture 400 includes the array of pixels 402 in rows and columns (such as N rows and M columns) where each row of pixels is driven by a row driver 404 within a set of row drivers. The display architecture 400 further includes a set of shift registers 406 and a set of hold registers 408 that control the columns of pixels. Between the hold registers 408 and the pixel columns are a pair of transistors 410 which is the first set of pixel column electrical components. The transistors may be represented as $TsL_{-i}$ (for data low) and $TsH_{-i}$ (for data high) where i represents the column number.

In the embodiment of FIG. 4a, as with the embodiment of FIG. 3a, the data is separated into two parts, which may be seen as a more significant part or sub-segment and a less significant part or sub-segment. The shift registers 406 store the data associated with the less significant part of data (DATAL). At the rising edge of the clock, the data in the shift registers is transmitted or transferred into the hold registers 408. When $V_{L1}=0$ and $V_{H1}=1$, the TsL transistors are on and the TsH transistors are off. Therefore, the intrinsic capacitor of the DATAL data lines is charged or discharged, according to the stored values in the hold registers 408. In the next cycle, the values in the hold registers are updated with the data associated with the more significant part of data (DATAH). The select lines of the demultiplexer (as shown in FIG. 4a) change to $V_{L1}=1$ and $V_{H1}=0$, such that the TsH transistors are on and the TsL transistors are off. Therefore, the values in the hold registers 408 may charge or discharge the DATAH lines' intrinsic capacitor.

Figure 4B:
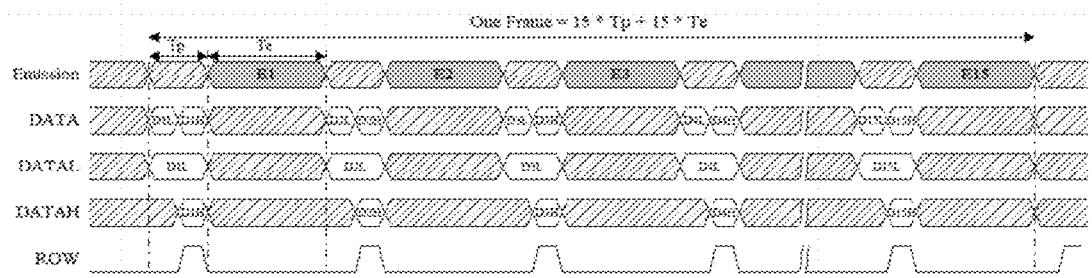
Figure 4C:
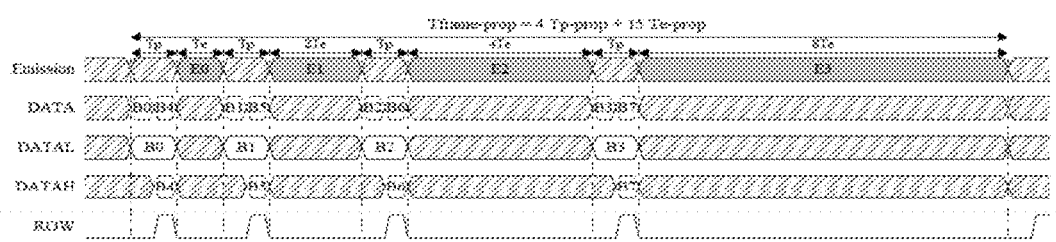

FIG. 4b shows the detail of data lines during a single frame time using the unweighted PWM method. As illustrated, DATA value changes from DATAL to DATAH during a programming time cycle and the multiplexer select signals work in a way that each data line gets the proper value. As a result, at the time that the row signal is enabled, both storage capacitors ($C_{s1}$ and $C_{s2}$) in the pixel circuit receive the expected values. The same procedure is valid for the weighted PWM method which is illustrated in FIG. 4c in the form of a frame time.

In another embodiment, the disclosure may address another problem in some current OLED displays whereby as OLED displays become more efficient, they consume less current for the same light intensity. Consequently, the driver current needs to be matched and reduced with an appropriate gate voltage. However, even a small or minimum sized MOS transistor can produce much larger on-current than required by the OLED. Therefore, it is necessary that the highest voltage value stored in the capacitor be much less than the default $V_{dd}$.

Figure 5A:
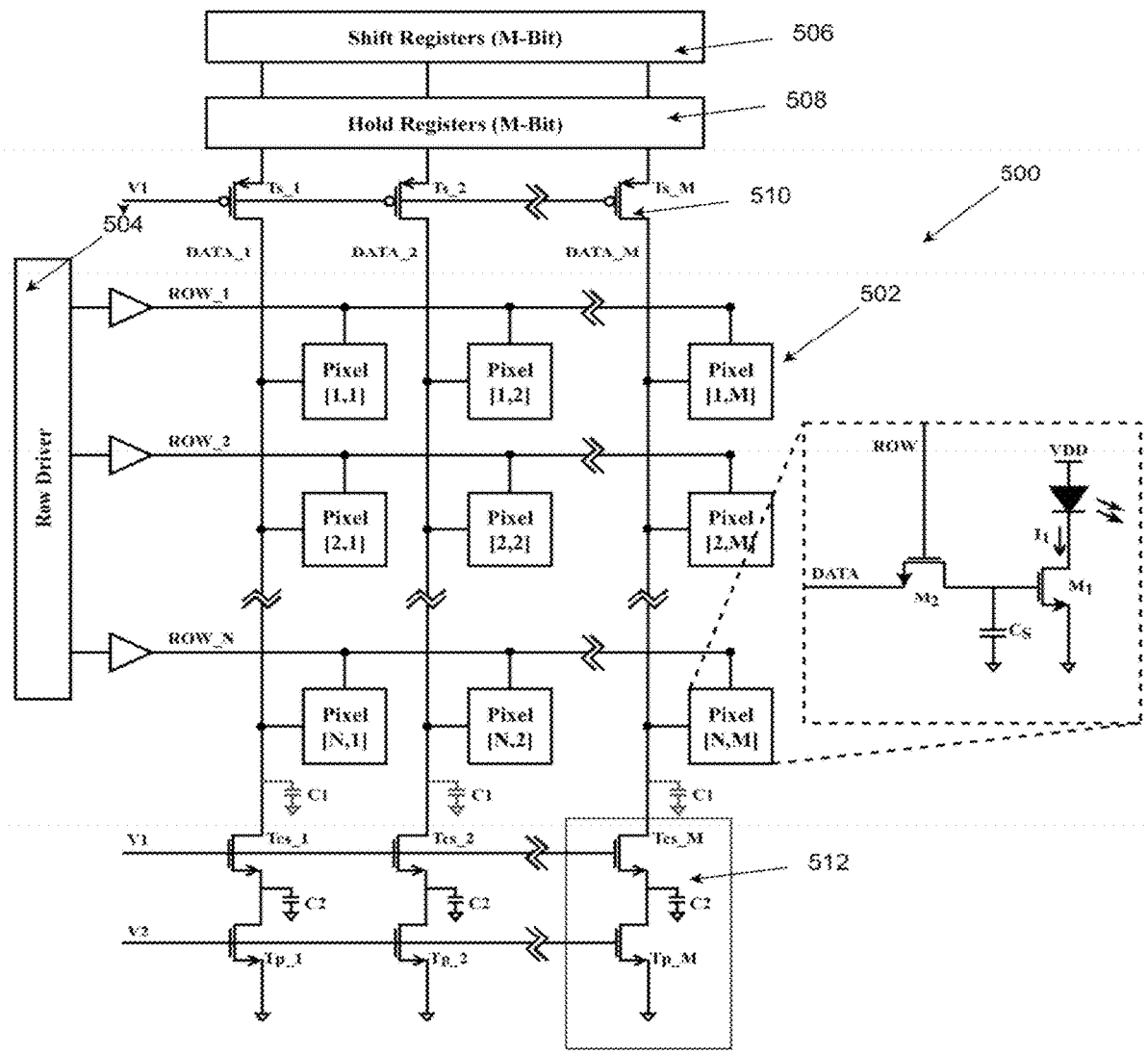
FIG. 5a is a schematic diagram of an architecture for a N*M display with column signal processing in accordance with the disclosure.

As shown in FIG. 5a, another embodiment of an N*M display architecture is shown that addresses this problem. The signal processing technique disclosed above, can be applied to each column of the display to create, or generate, a desired voltage value for the logical '1'. As a result, a voltage value that is less than $V_{dd}$ will be stored on the driver storage capacitor, and the appropriate, or desired, current through the driver transistor is realized.

In FIG. 5a, similar to FIG. 14a, the display 500 includes a set of pixels 502 that are arranged in a grid-like manner in rows and columns with individual rows of pixels driven by individual row drivers 504 that are part of a set of row drivers and individual columns of pixels driven by individual shift 506 and hold registers 508 from a set of shift and hold registers, respectively. Between the shift and hold registers and the column of pixels is a transistor 510 (seen as a first set pixel column electrical components). Each pixel column is also connected to a second set pixel column electrical components 512 (seen as component 1414 in FIG. 14) where the second set pixel column electrical components includes a capacitor ($C_1$) and a pair of transistors with one transistor's gate connected to $V_1$ and the other transistor's gate connected to $V_2$ with a second capacitor $C_2$ connected between the two transistors. The display 500 further includes a first set of pixel row electrical components 514, seen as a buffer, between the row drivers and each pixel row.

In the embodiment of FIG. 5a, capacitor $C_1$ may be seen as an equivalent parasitic capacitor of one column (data line) of the pixel array and capacitor $C_2$ is a capacitor for charge sharing. As shown in the timing diagram of FIG. 5b, during time slot t1, $T_p$ and $T_{cs}$ are on and $T_s$ is off; so, the capacitors of the pixel column are discharged to zero via the $T_p$ and $T_{cs}$ transistors. Subsequently, during time slot t2, $T_p$ and $T_{cs}$ are off and $T_s$ is on such that the hold registers for each respective column of pixels have a logical value of '1' charges to $V_{dd}$.

Figure 5B:
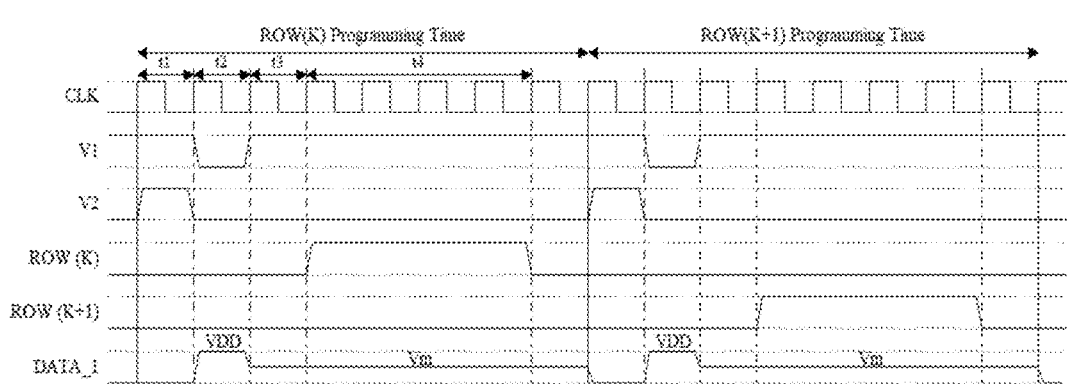

As a further example with respect to FIG. 5b, the desired values to be stored in the pixel [K,1] and [K+1, 1], are logical '1', such that during their programming times, the corresponding column ($1^{st}$) is charged to $V_{dd}$. Afterward, in time slot t3, transistors $T_s$ and $T_p$ are off and $T_{cs}$ is on; therefore, $C_1$ and $C_2$ start to charge share and the final value for the column is $V_m$, which is the desired voltage value needed to be stored on the pixel circuit capacitor to drive the desired current through OLED. By choosing the correct value for $C_2$ based on the value of $C_1$ and $C_S$, any desired value less than $V_{dd}$ may be controlled or generated for $V_m$. In other embodiments, $V_m$ can be made programmable with an appropriate capacitor bank and controlling switches.

Figure 6A:
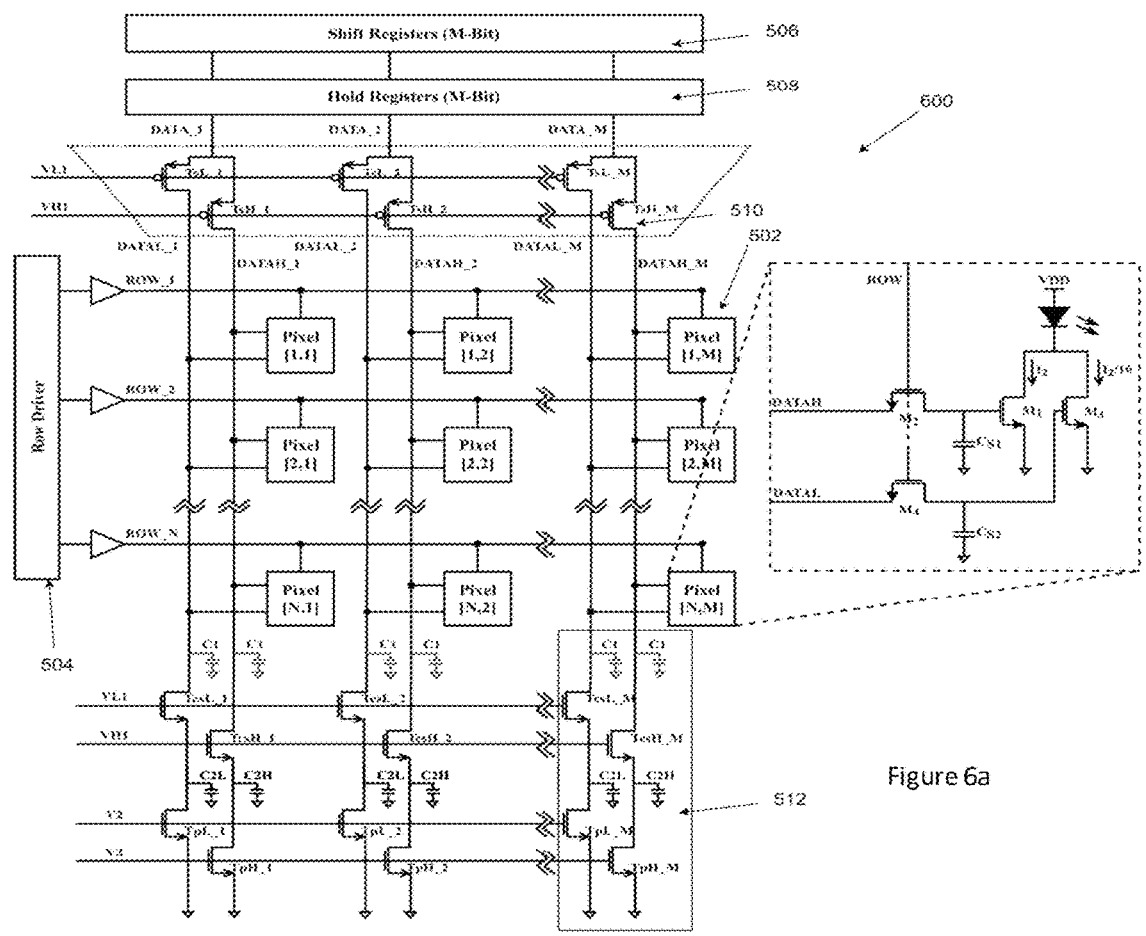
FIG. 6a is a schematic diagram of another embodiment of a N*M display with column signal processing in accordance with the disclosure.

Turning to FIG. 6a, another schematic diagram of a N*M display architecture in accordance with the disclosure is shown. The display embodiment 600 of FIG. 6a may be seen as a combination of the embodiments of FIGS. 4a and 5a with the numbering of FIGS. 4a and 5a.

As shown in FIG. 6a, at the end of each pixel column, two further transistors (as part of the set of back end pixel column electrical components) can be added that operate or function as switches. Each data line may also include a further capacitor (i.e. C2H or C2L) which may provide the functionality to create, or generate, a voltage level required for two different current levels in the dual-driver pixel circuit. These components may be seen as a second set of pixel column electrical components.

As discussed above, when the digital data bits are split into two parts, the current corresponding to the data with the less significant four bits (DATAL) is approximately 16 times smaller than the current which corresponds to the more significant four bits (DATAH). Assuming that DATAH and DATAL values needed to store in the pixel circuit are both logical '1', DATAL charges the storage capacitor $C_{S2}$ to the voltage level of $V_{m2}$ and DATAH charges $C_{S1}$ to the voltage level of $V_{m1}$.

Figure 6B:
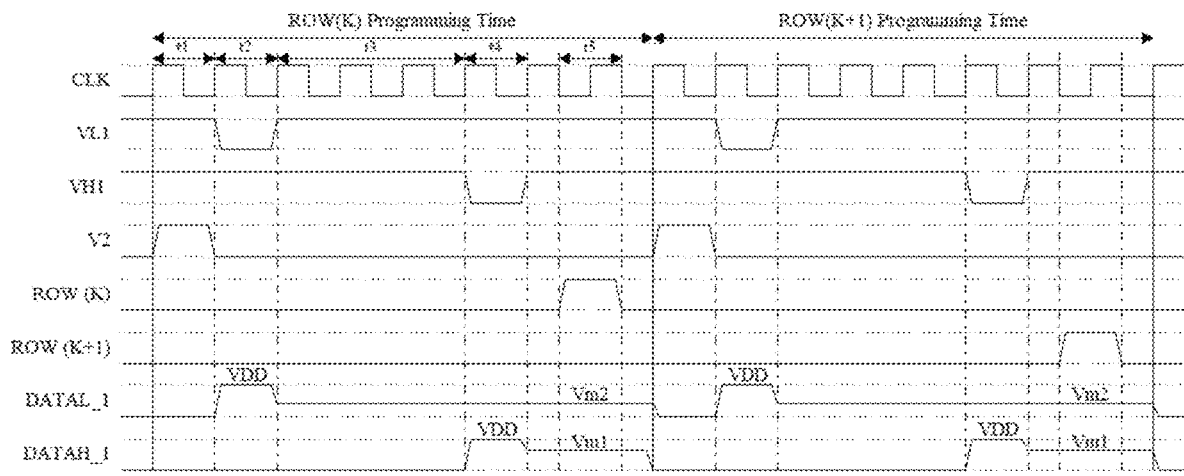

In order to obtain or achieve the difference of 16 times required for the current through transistors $M_1$ and $M_3$ of each pixel (seen in inset of FIG. 6a), two different voltage levels representing logical '1' may be used. Other solutions to obtain or achieve the difference between $M_1$ and $M_3$ currents are also contemplated. As shown in the waveforms of FIG. 6b, $V_{m1}>V_{m2}$ to create the required difference in currents using the signal processing methodology discussed above. Since there are two data lines for each pixel column, it is necessary to settle the correct values before enabling the ROW signal. As shown in the waveforms of the time frame of FIG. 6b, it is assumed that the DATAH and DATAL values needed to be stored in the capacitors are logical '1'. Therefore, during time slot $t_2$, DATAL charges to $V_{dd}$ and at $t_3$, the column capacitor $C_1$ charge shares with $C_{2L}$, and eventually the column voltage settles to the $V_{m2}$ value. The same procedure produces a $V_{m1}$ value during time slot $t_4$ and after. As a result, when the access transistors (i.e. $M_2$ and $M_4$) are enabled during $t_5$, the storage capacitors $C_{S1}$ and $C_{S2}$ charge to the expected values of $V_{m1}$ and $V_{m2}$.

In one implementation, the display architecture 600 of FIG. 6a has been implemented for a display size of 480×640 (VGA) and a refresh rate of 60 Hz. In this embodiment, the implementation may be to dynamically or actively reduce power consumption. Post simulation results showed a 41% reduction in the average dynamic power consumption of the display drivers in this embodiment of the architecture compared to a conventional architecture. Also, the total average power reduction in driver's circuit is 38%. The power consumption of the pixel arrays may remain the same since power consumption is directly proportional to the displayed image.

In the above, embodiments of architectures provide a low-power active matrix display with digital dual driver methods; however, embodiments of the dual driver methodology may be applied to other driving methods for reducing power consumption or increasing color depth, resolution, and refresh rate.

Figure 7A:
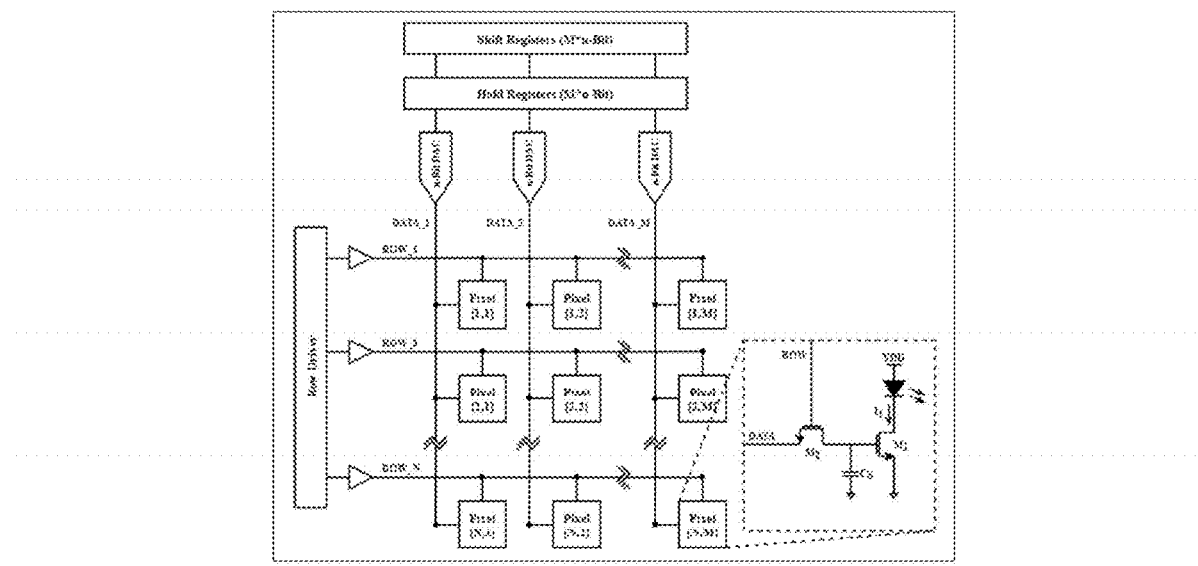
FIG. 7a is a schematic diagram of a conventional N*M display with an analog driving method.
Figure 7B:
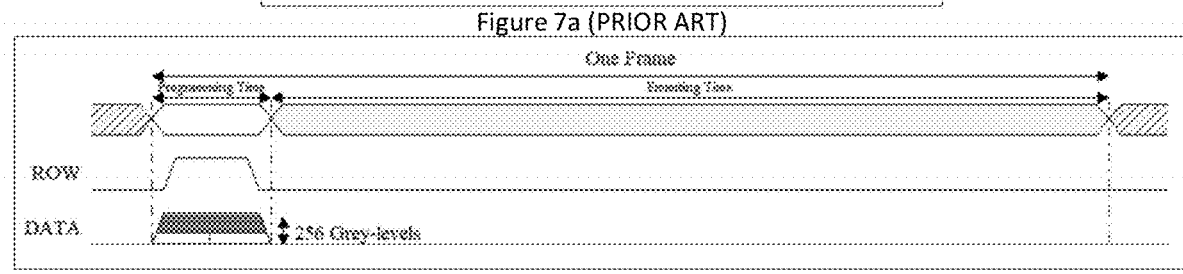

FIG. 7a illustrates an embodiment of a display and pixel architecture for a conventional analog driving method. For each column, an n-Bit DAC is required to convert the digital data of each pixel in the row to a corresponding analog voltage. The size of shift and hold registers is n (color depth) times more in this architecture compared to its digital counterpart. Since it is necessary to have all bits of data converted to analog at once, FIG. 7b demonstrates the timing diagram for a frame with a conventional analog driving method for a color depth of 8 bits and an 8-bit DAC providing an analog grey level of data for the data line. As shown, the ROW signal turns on the access transistors of pixels in a row, and each analog data line charges the storage capacitor ($C_s$) of its corresponding pixel. Afterward, during the emission time of this row, the row driver scans the rest of the rows in the display and set those storage capacitors to their desired analog grey levels.

Figure 8A:
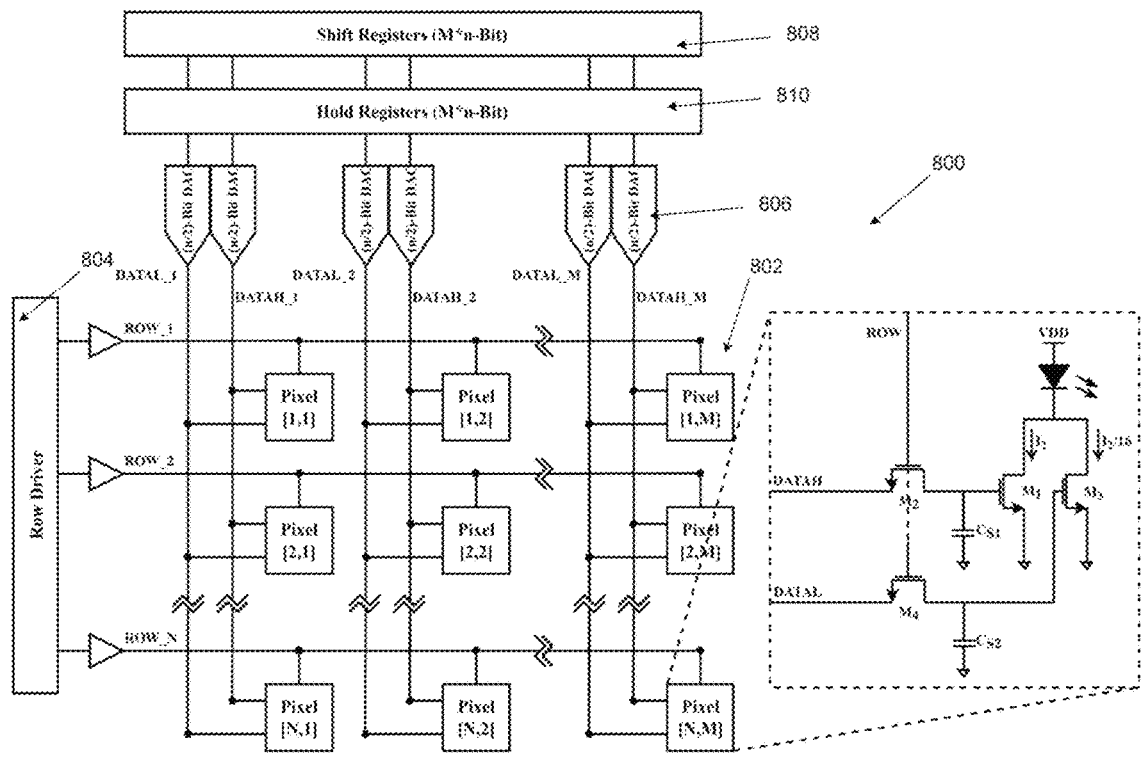
FIG. 8a is a schematic diagram of another embodiment of a N*M display with an analog driving method in accordance with the disclosure.

Turning to FIG. 8a, another embodiment of a N*M display architecture is shown. The embodiment may be seen as a dual-driver technique with an analog driving method.

The display architecture 800 includes an array of pixels 802, arranged in a grid-like manner with N rows and M columns of pixels. A set of row drivers 804 drive individual rows of pixels and a set of shift registers 808 and a set of hold registers 810 drive individual columns of pixels or pixel columns. Between the hold registers and the pixel columns is a first set pixel column electrical components 806 including a pair of DACs.

Figure 8B:
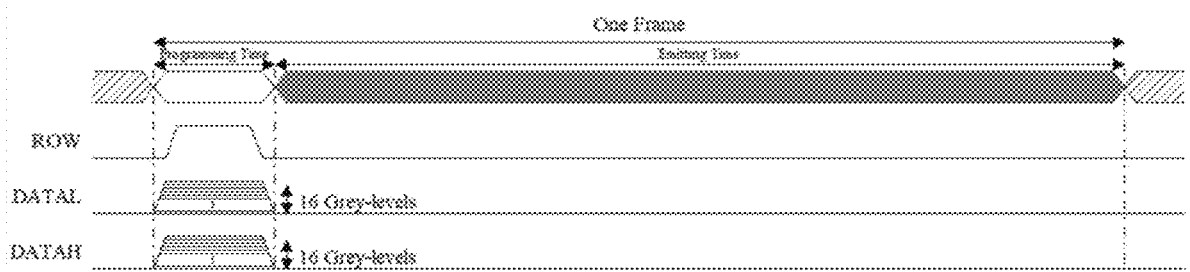

As discussed above, the 8-bit data is split into two 4-bit data parts which may be seen as DATAH and DATAL. In the current embodiment, each data part, or sub-segment, is dealt with individually with its corresponding driver, where a current of the driver for the less significant bits is 16 times smaller than the other one. Therefore, instead of one n-bit DAC, such as shown in the conventional apparatus of FIG. 7a, the embodiment of FIG. 8a includes two (n/2)-bit DACs. Thus, for a color depth of 8 bits, the DACs provide 16 grey levels instead of 256 grey levels. As such, operational requirements on the DAC are greatly relaxed, and at the same time, its power consumption is also decreased. As power consumption of DACs increases exponentially with respect to the number of bits, using two 4-bit DACs requires much less power consumption compared with a single 8-bit DAC. It is noted that the size of the shift and hold registers may be the same size as used for conventional architectures. FIG. 8b shows the timing diagram for the analog scheme of the embodiment of FIG. 8a. With the dual driver, there are two data lines instead of one data line whereby the two data lines may receive any value from sixteen different grey-levels between 0 and $V_{dd}$. Since the current embodiment operates in an analog domain, the operational frequency remains the same as a conventional architecture, however, the complexity of the design and the power consumption of the embodiment decrease substantially when compared with at least some conventional solutions.

As discussed above, the first set of pixel column electrical components in the embodiment of FIG. 8a include two DACs per pixel (or pixel column).

Figure 9A:
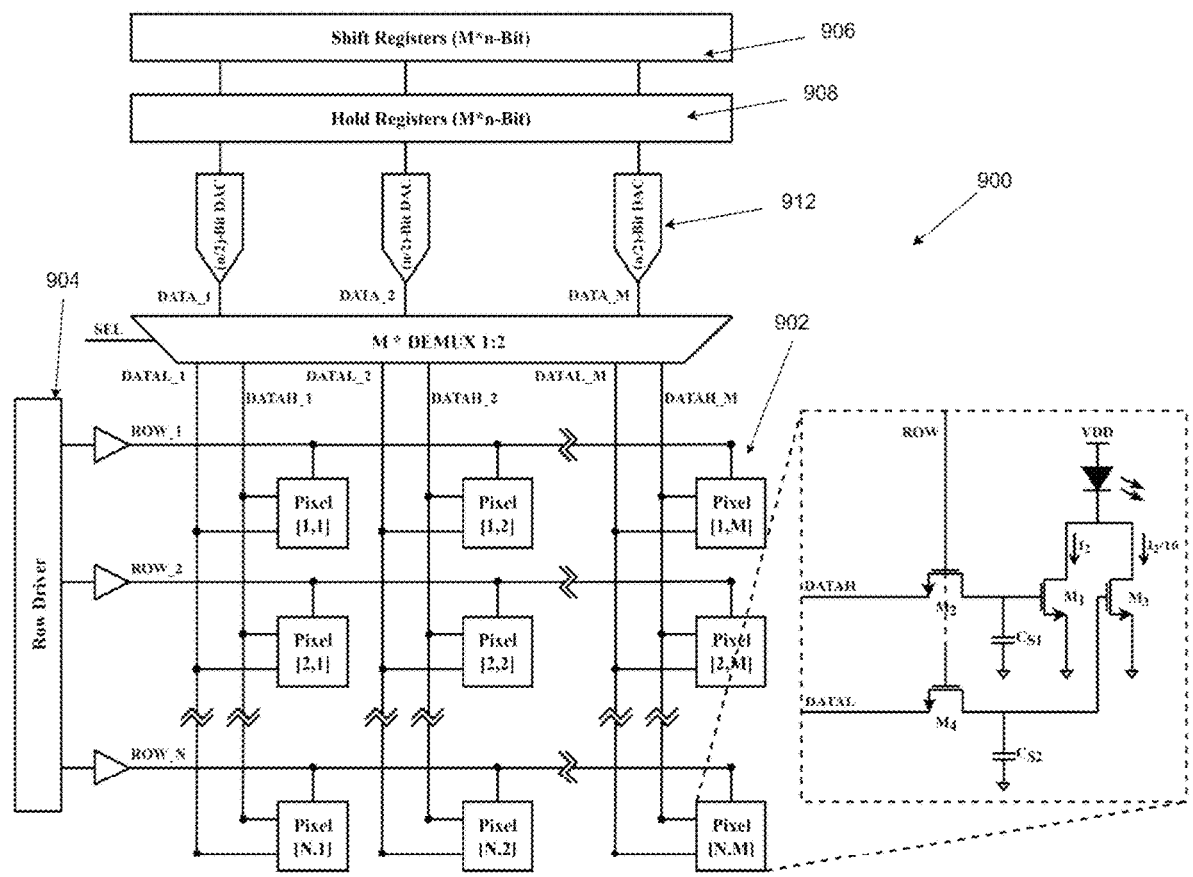
FIG. 9a is a schematic diagram of a further embodiment of a N*M display with analog driving method in accordance with the disclosure.

In a further embodiment, by doubling the operating frequency of the DAC and using a 1:2 demultiplexer, the number of DACs may be decreased to half. Turning to FIG. 9a, a further embodiment of an N*M display architecture is shown which has a smaller footprint as the area required for a 2:1 demultiplexer is less than the area required for a DAC.

In the embodiment of FIG. 9a, the display architecture 900 includes a set of pixels 902 positioned in a grid like manner with N rows and M columns. The rows of pixels are driven by a row driver from a set of row drivers 904 while a set of shift registers 906 and a set of hold registers 908 provide data of the pixel columns. In the embodiment of FIG. 9a, the display 900 further includes a first set of pixel column electrical components 912 between the hold registers 908 and the pixel columns. In this embodiment, the first set of pixel column electrical components include one DAC 2:1 per pixel column and a single demultiplexer.

Figure 9B:
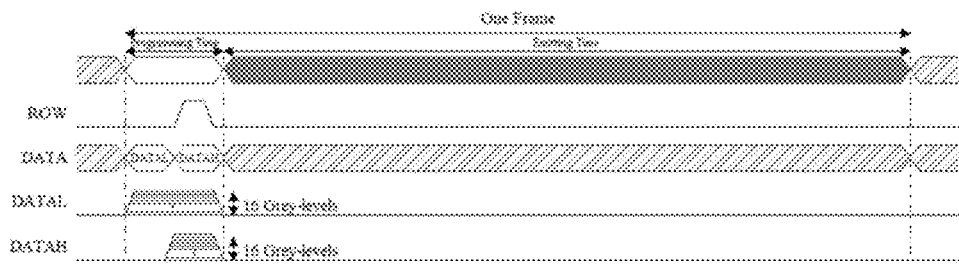

As illustrated in the waveforms of the timing diagram of FIG. 9b, the available DAC per pixel converts the less significant 4 bits of data during the first half of the programming time and the demultiplexer connects the DAC's outputs to the DATAL data lines. The capacitors of the pixel columns charge to their proper analog values and sustain the value until the programming time for the subsequent row. During the second half of the programming time, the same DAC converts the more significant 4 bits of data to its analog grey-level. By selecting a predetermined value for the demultiplexer, the DAC's outputs may be connected to the DATAH data lines. Therefore, the pixel column capacitors associated with DATAH charge to their proper values. After both DATAL and DATAH reach a steady state on the data lines, the access transistors (i.e. $M_2$ and $M_4$) for all pixels in the row turn on and the storage capacitors charge to their relevant, or required, values. As such, in this architecture, one (n/2)-bit DAC operates at twice frequency to provide the values and like the previous architecture, the power consumption is much less than the conventional analog architecture.

In further embodiments, the dynamic power consumption can be further reduced by recycling power stored on the parasitic capacitor of each pixel row. In general, row drivers sequentially scan all rows in the display one at a time and repeat the same operation. Sequential row driving is universal irrespective of which data driving (digital or analog) technique is used. In embodiments of the disclosure discussed below, the energy stored on the row capacitor can be charged shared with the next row, so that the energy required to charge the next row may be reduced. Also, the power consumed from the supply voltage may be reduced substantially.

Figure 10A:
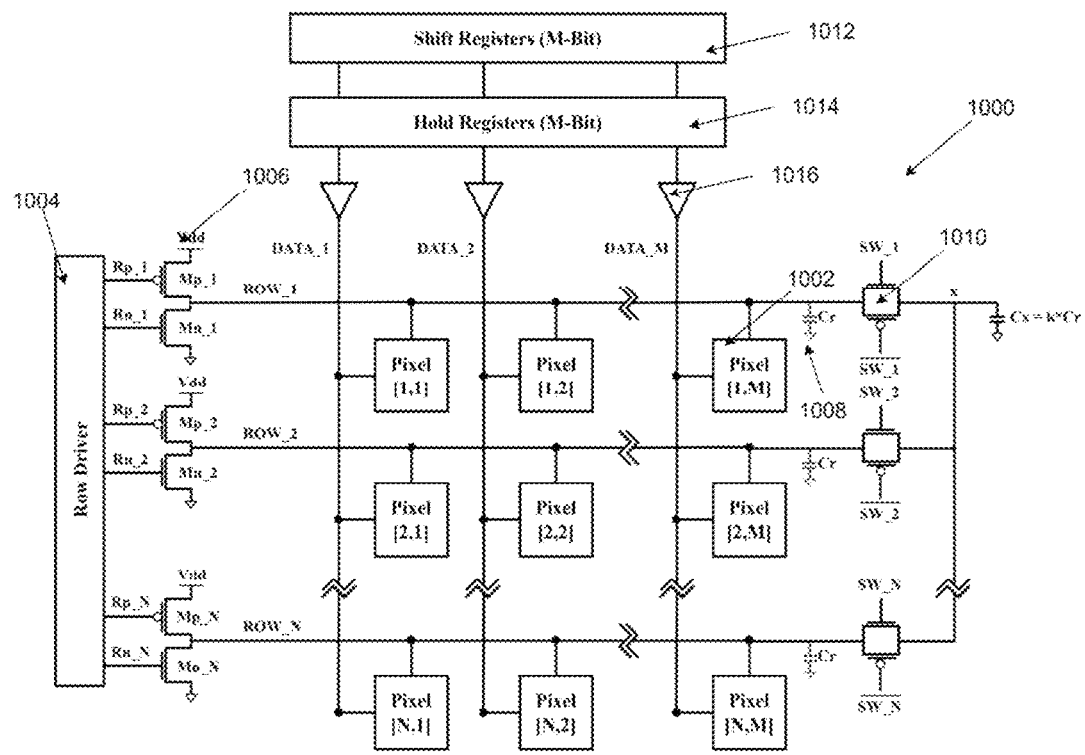
FIG. 10a is a schematic diagram of another embodiment of a N*M display with row energy recycling technique in accordance with the disclosure.

Turning to FIG. 10a, another embodiment of a N*M display architecture is shown. The embodiment of FIG. 10a may be seen as an N*M display with the row energy recycling. The display architecture 1000 includes an array of pixels 1002 that are arranged in a grid-like fashion in N rows and M columns. The rows of pixels are driven by individual row drivers within a set of row drivers 1004. Between the set of row drivers 1004 and each pixel row is a first set of pixel row electrical components including a pair of transistors 1006. Each pixel row also includes a parasitic capacitor 1008 shown at the end of the row of pixels connected to a transmission gate or switch 1010 and a further capacitor 1016 for energy recycling. The parasitic capacitor, the switch and the further, or energy recycling, capacitor may be seen as a second set of pixel row electrical components. In the current embodiment, the parasitic capacitor may be seen as capacitor $C_r$ and the further capacitor (or capacitor for energy recycling) may be seen as capacitor $C_x$. In this embodiment, instead of the row inverter (such as shown in the prior art design of FIG. 2a), two separate signals are connected to the $M_n$ (NMOS technology) and $M_p$ (PMOS technology) transistors of the set of front end pixel row electrical components.

The pixel columns are controlled by a set of shift registers 1012 and a set of hold registers 1014. Each pixel column also includes a buffer (seen as the first set pixel column electrical components 1016) between the pixel column and its associated hold register.

Figure 10B:
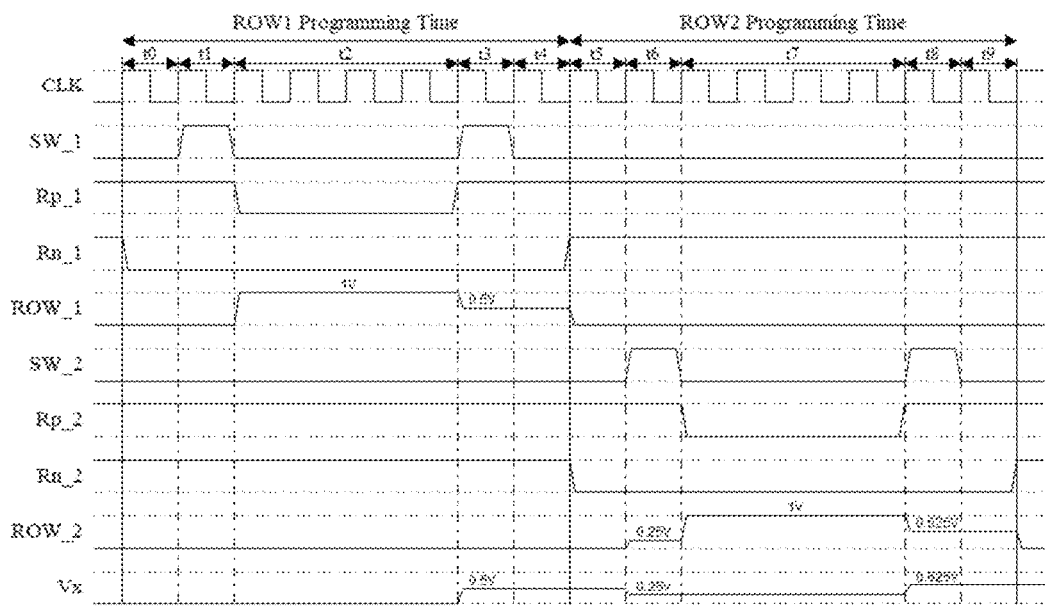

In one example or specific embodiment, assume that $C_x=C_r$, $V_{dd}=1V$, and the initial voltage on the energy recycling capacitor $C_x$ is zero. FIG. 10b shows the waveform of the control and row signals for the first two rows of the display architecture.

At time $t_0$, Mn_1, Mp_1, and SW_1 are off and at time $t_1$, SW_1 turns on, but since this is the first pixel row, there is no stored energy in the energy recycling capacitor $C_x$ and the ROW_1 stays at zero volts. At time $t_2$, the parasitic capacitor $C_r$ for the row (row 1) charges to $V_{dd}$ via transistor Mp_1. The ROW_1 signal is equal to $V_{dd}$ and all access transistors of that row are enabled to store the data line values in the storage capacitor of the pixel circuits. After that, during time $t_3$, transistor Mp_1 turns off, SW_1 turns on and the parasitic capacitor $C_r$ of the first row starts to charge share with energy recycling capacitor $C_x$. Since the value for capacitor $C_x$ is set to be equal to $C_r$, the final voltage after charge sharing is 0.5V. The signal to SW_1 is then disabled.

At the end of the programming time for this row ($t_5$), Mn_1 turns on and discharges the remaining charge on the first row's parasitic capacitor $C_r$ to ground. Afterward, during the programming time of the next row, at time $t_6$, SW_2 turns on and enables the charge sharing between the energy recycling capacitor $C_x$ and the parasitic capacitor $C_r$ of the second row. As a result, a portion of energy that is saved on the energy recycling capacitor $C_x$ is reused to charge the parasitic capacitor $C_r$ of row 2 to 0.25V. Then at time $t_7$, the parasitic capacitor of row 2 charges from 0.25V to 1V via the Mp_2 transistor of row 2. This is repeated for the rest of the rows in the display. Each time that a row is charged to $V_{dd}$, a portion of energy stores on the energy recycling capacitor $C_x$ for future reuse and the rest discharges to the ground. For each time that a parasitic capacitor $C_r$ needs to charge, it first receives half of what is stored on the energy recycling capacitor and then it charges to $V_{dd}$ via the PMOS transistor of that row.

FIG. 10b illustrates one waveform for the first two rows. It is understood that the energy recycling process is the same for the rest of the rows with a slight change in the stored voltages on the energy recycling capacitor $C_x$. As this process repeats, the stored voltage on the energy recycling capacitor $C_x$ rises slowly until it reaches a saturated value. For example, in experimentation, the stored voltage on $C_x$ for the second, third, fourth, and fifth rows are 0.5V, 0.625V, 0.656V, and 0.664V, respectively and it saturates at 0.666V.

This embodiment was simulated on a 1536×2048 display with a refresh rate of 60 Hz using an unweighted PWM driving method. Based on the post-layout simulation of the pixel circuit, or array, the row parasitic capacitance per pixel is approximately 1 fF. Therefore, $C_r$ is equal to 1.5 pF and the programming time was 42.5 ns. Simulation results showed that this technique decreased the dynamic power needed to charge the row capacitors by approximately 28%. However, generating extra control signals like Rp_i, Rn_i, and SW_i required additional power consumption in the control signal generation part. Considering the effect of these overheads the total row driver's power was reduced by 22% with this embodiment. It is noted that the dynamic power consumption of the row driver was reduced by 24.5%.

In the above description, the $C_x/C_r$ ratio was assumed to be one, however, it may be desirable to determine a ratio that creates the highest energy recycling level. To determine this ratio, the capacitor charge sharing equation can be seen in Equation 14 as:

$$Q_t = Q_{t+1} \qquad \text{Eq. 14}$$

Applying this equation at time $t_2$ and $t_3$ for $$\frac{C_x}{C_r} = k$$

results in the following equations:

$$C_r * V_{ROW\_1}(t_2) + C_x * V_x(t_2) = C_r * V_{ROW\_1}(t_3) + C_x * V_x(t_3) \qquad \text{Eq. 15}$$

$$C_r * Vdd + kC_r * 0 = C_r * V_x(t_3) + kC_r * V_x(t_3) \qquad \text{Eq. 16}$$

$$V_x(t_3) = \frac{Vdd}{1+k} = V_x(t_5) \qquad \text{Eq. 17}$$

Therefore, with the voltage stored on the energy recycling capacitor calculated, this voltage may be transferred to the parasitic capacitor of the next row. $V_x$ remains the same from $t_3$ until the end of $t_5$. Applying the same equation for the charge sharing between $t_5$ and $t_6$ provides the final steady state voltage on next row's capacitor may be represented by Equations 18, 19 and 20:

$$C_r * V_{ROW\_2}(t_5) + C_x * V_x(t_5) = C_r * V_{ROW\_2}(t_6) + C_x * V_x(t_6) \qquad \text{Eq. 18}$$

$$C_r * 0 + kC_r * \frac{Vdd}{1+k} = C_r * V_{ROW\_2}(t_6) + kC_r * V_{ROW\_2}(t_6) \qquad \text{Eq. 19}$$

$$V_{ROW\_2}(t_6) = \frac{k * Vdd}{(1+k)^2} \qquad \text{Eq. 20}$$

$V_{ROW\_2}(t_6)$ may be seen as the amount of recycled voltage on the second row based on the k parameter. The maximum, or highest, voltage may be calculated in Equation 21 as:

$$\max\left\{\frac{k}{(1+k)^2}\right\} = 0.25 \text{ at } k = 1 \qquad \text{Eq. 21}$$

Therefore, in this embodiment architecture, the maximum, or high, voltage that is possible for recycling, in the first round is $0.25*V_{dd}$ which happens for k=1 where k is the ratio between $C_x$ and $C_r$.

Figure 11A:
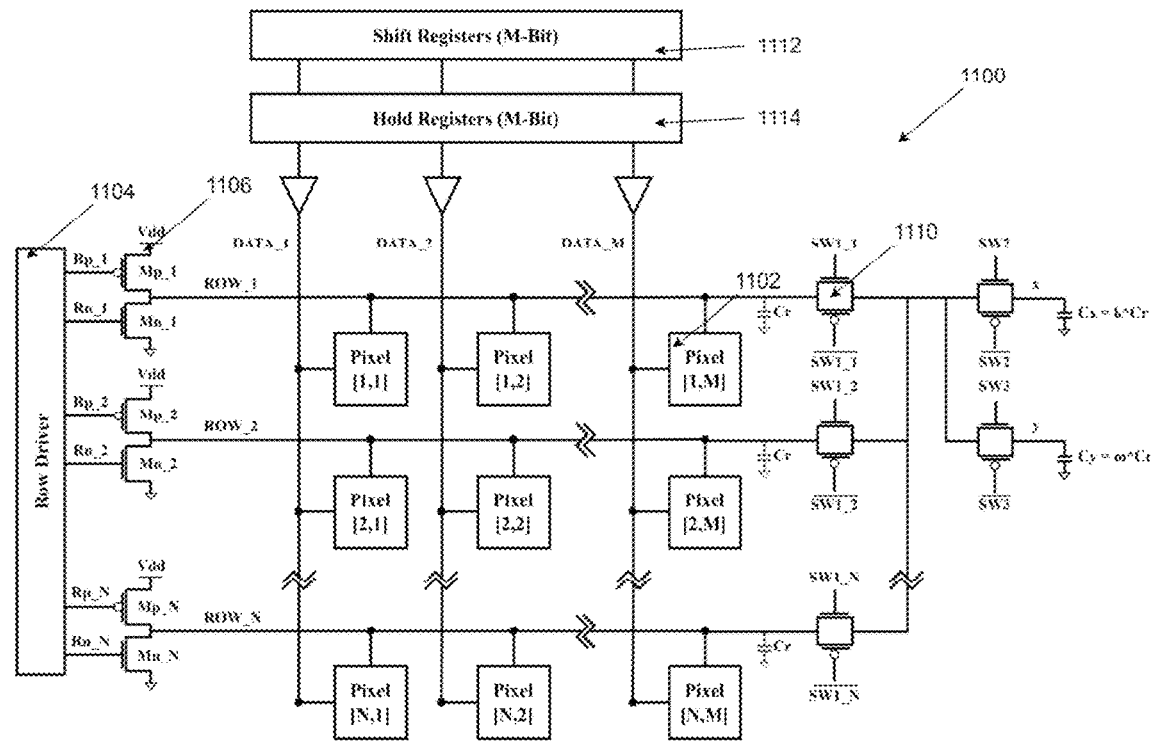
FIG. 11a is a schematic diagram of yet another embodiment of a N*M display with row energy recycling technique in accordance with the disclosure.

In another embodiment, in order to recycle a higher level of voltage from row to row, a further embodiment architecture is shown in FIG. 11a. In the embodiment of FIG. 11a, the display architecture includes multiple sequential charge sharing capacitors.

As can be seem, the display architecture 1100 includes an array of pixels 1102 that are arranged in a grid-like fashion in N rows and M columns. The rows of pixels are driven by individual row drivers within a set of row drivers 1104. Between the set of row drivers 1104 and each pixel row is a pair of transistors 1106 which may be seen as a first set of pixel row electrical components. Each pixel row also includes a parasitic capacitor ($C_r$) 1108 shown at the end of the row of pixels connected to a switch (SW1) 1110 which may be part of the second set of pixel row electrical components.

The pixel columns are controlled by a set of shift registers 1112 and a set of hold registers 1114. Each pixel column also includes a first set of pixel column electrical components 1116 located between the set of hold registers 1114 and the column of pixels. In the current embodiment, the first set pixel column electrical components includes a buffer.

The display architecture 1100 further includes a pair of switches (Sw2 and SW3) connected to a pair of energy recycling capacitors $C_x$ and $C_y$ which may also form part of the second set of pixel row electrical components.

In this embodiment architecture, instead of one capacitor at the end of the pixel rows, there are two energy recycling capacitors. The second capacitor ($C_y$) provides the functionality to recycle further energy, i.e. the energy that in the embodiment of FIG. 10a was discharged to ground. Also, in comparison with the embodiment of FIG. 10a, two extra transmission gates (seen as the switches) may be used to choose one of the energy recycling capacitors in the case of charge sharing. As a result, instead of one charge and discharge step in ROW_i signals, there are two steps for both charging and discharging. Thus, the ROW_i signals, in general, are similar to ROW_2 illustrated in FIG. 11b. It is assumed that k=0.5 and m=1. This will be discussed further below.

Figure 11B:
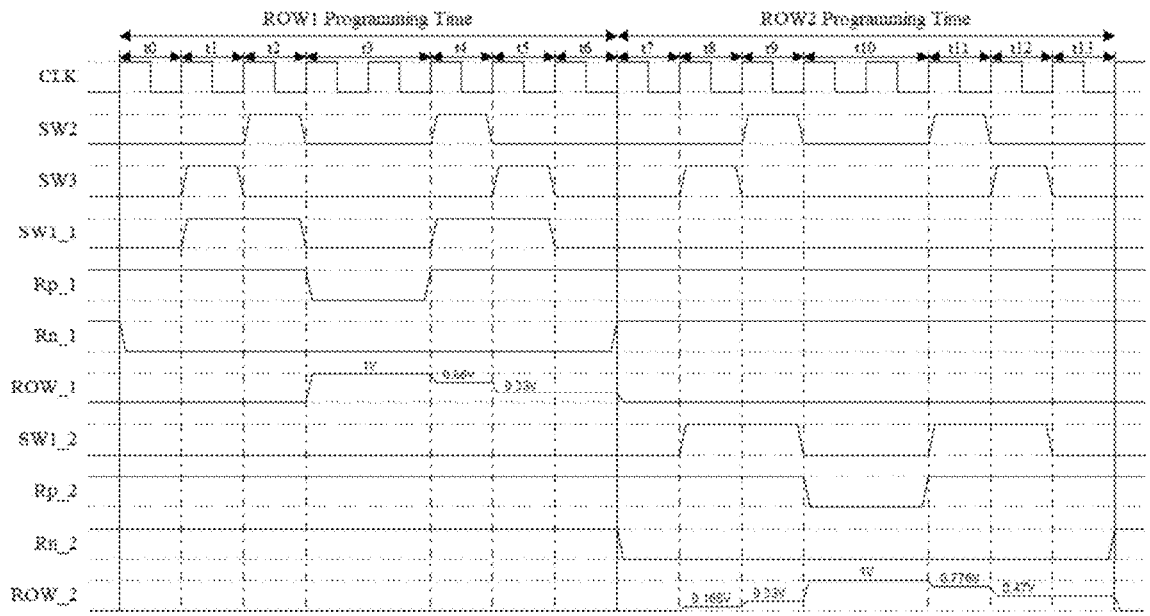

FIG. 11b provides a timing diagram showing control and row signals waveform for the first two rows of pixels. In the programming time of the first row, during $t_1$ and $t_2$, ROW_1 stays at zero volts, since it is assumed there is no initial charge on capacitors $C_x$ and $C_y$. After ROW_1 charges to $V_{dd}$ via Mp_1, during $t_4$, SW1_1 and SW2 are on to enable charge sharing between first row's parasitic capacitor $C_r$ and energy recycling capacitor $C_x$.

Considering k=0.5 and a steady state voltage of 0.66V, at time $t_5$, SW2 turns off and SW3 turns on enabling the charge sharing of the row capacitor with $C_y$. Based on the equal size of these capacitors and their initial voltages (i.e. 0.66V for $C_r$ and zero volts for $C_y$), the steady state voltage is 0.33V. For the next row programming time, these stored voltages should be used or transferred before charging the next row's parasitic capacitor via Mp_2. Therefore, during $t_8$, SW1_2 and SW3 are on and SW2 is off and the second row's parasitic capacitor $C_r$ charges to 0.166V. At $t_9$ SW2 turns on and SW3 turns off, which enables charge sharing between $C_r$ and $C_x$. The steady state voltage based on their initial values and ratio is 0.33V. A similar procedure is repeats for the rest of the pixel rows.

To examine an effect of the embodiment architecture of FIG. 11a on power reduction, a 1536×2048 display was simulated with a refresh rate of 60 Hz and an unweighted PWM driving method. The $C_r$ capacitor was approximately 1.5 pF. Simulation results showed a 35.5% reduction in the dynamic power consumption needed to charge the row capacitors. Considering the overhead of generating control signals (i.e. Rp_i, Rn_i, SW_i, SW_2, and SW3) for each row driver in this embodiment, the overall dynamic power reduction of the row driver is 25.5%. Since this embodiment reduces the dynamic power consumption, it is notable that the row driver's dynamic power is reduced by 28%.

As discussed above, there may be a desired or preferred ratio between the sizes of the parasitic and energy recycling capacitors (i.e. k and m) to allow recycling the maximum, or a high, voltage. Applying the charge sharing equation (Equation10) at $t_3$ and $t_4$ gives the stored voltage on $C_x$ as represented in Equations 22 to 24:

$$C_r * V_{ROW\_1}(t_3) + C_x * V_x(t_3) = C_r * V_{ROW\_1}(t_4) + C_x * V_x(t_4) \quad \text{Eq. 22}$$

$$C_r * Vdd + kC_r * 0 = C_r * V_x(t_4) + kC_r * V_x(t_4) \quad \text{Eq. 23}$$

$$V_x(t_4) = \frac{Vdd}{1+k} = V_x(t_8) \quad \text{Eq. 24}$$

During the charge sharing phase between the first row's parasitic capacitor $C_r$ and energy recycling capacitor $C_y$ (as represented in Equations 25 to 27):

$$C_r * V_{ROW\_1}(t_4) + C_y * V_y(t_4) = C_r * V_{ROW\_1}(t_5) + C_y * V_y(t_5) \quad \text{Eq. 25}$$

$$C_r * \frac{Vdd}{1+k} + mC_r * 0 = C_r * V_y(t_5) + mC_r * V_y(t_5) \quad \text{Eq. 26}$$

$$V_y(t_5) = \frac{Vdd}{(1+k)(1+m)} = V_y(t_7) \quad \text{Eq. 27}$$

As a portion of first row's voltage has been stored on energy recycling capacitors $C_x$ and $C_y$, at time $t_8$, $C_y$ starts to charge share with second row's parasitic capacitor $C_r$ to recycle a part of the energy from the previous row. Considering the fact that $V_y$ remains the same from $t_5$ until the end of $t_7$, the ROW_2 voltage at is may be calculated using Equations 28 to 30:

$$C_r * V_{ROW\_2}(t_7) + C_y * V_y(t_7) = C_r * V_{ROW\_2}(t_8) + C_y * V_y(t_8) \quad \text{Eq. 28}$$

$$C_r * 0 + mC_r * \frac{Vdd}{(1+k)(1+m)} = C_r * V_{ROW\_2}(t_8) + mC_r * V_{ROW\_2}(t_8) \quad \text{Eq. 29}$$

$$V_{ROW\_2}(t_8) = \frac{m * Vdd}{(1+k)(1+m)^2} \quad \text{Eq. 30}$$

The last charge sharing is between $C_x$ and the second row's parasitic capacitor $C_r$. Here VX does not change from $t_4$ until the end of is as represented by Equations 31 to 33:

$$C_r * V_{ROW\_2}(t_8) + C_x * V_x(t_8) = C_r * V_{ROW\_2}(t_9) + C_x * V_x(t_9) \quad \text{Eq. 31}$$

$$C_r * \frac{m * Vdd}{(1+k)(1+m)^2} + kC_r * \frac{Vdd}{1+k} = \quad \text{Eq. 32}$$

$$C_r * V_{ROW\_2}(t_9) + kC_r * V_{ROW\_2}(t_9)$$

$$V_{ROW\_2}(t_9) = \frac{Vdd}{(1+k)^2}\left[\frac{m}{(1+m)^2} + k\right] \quad \text{Eq. 33}$$

The $V_{ROW\_2}(t_9)$ is the second row's parasitic capacitor voltage after charge recycling based on k and m parameters. Its maximum, or high, value may be calculated by Equation 34 is:

$$\max\left\{\frac{1}{(1+k)^2}\left[\frac{m}{(1+m)^2} + k\right]\right\} = 0.33 \text{ at } k = 0.5 \text{ and } m = 1 \quad \text{Eq. 34}$$

So, the maximum, or a highest, energy recycling happens for k=0.5 and m=1.

In implementing the display architectures as discussed above, logic gates may be used to facilitate or assist in implementation such as within the row drivers. Various novel TFT logic gates are shown in FIGS. 12a to 12c and the operation of the gates is explained with regard to FIG. 13.

In one embodiment, there is provided a method and apparatus for CMOS-like logic gates with unipolar n-type TFTs. In one embodiment, logic gates of the disclosure experience more static leakage current reduction than current logic gates or diode-configured designs. In another embodiment, the logic gates of the disclosure have a smaller footprint than other current implementations.

In one embodiment of the disclosure, in order to address at least some deficiencies of current logic implementations, low transistor-count gates may be beneficial to realize area-efficient digital circuits. The disclosure is directed at logic gates with fewer TFTs having full output-swing and low static leakage-current advantages. More specifically, the disclosure is directed at embodiments of 5T inverters, 7T NAND gates and 7T NOR gates as shown in FIGS. 12a to 12c, respectively.

Turning to FIG. 12a, a schematic diagram of a 5T inverter in accordance with the disclosure is shown. The inverter 1200 receives a set of inputs including a VOD input 1202, an IN input 1204 and a Vss input 1206 which may be seen as voltages that are applied to or transmitted through the inverter 1200 and then out of the inverter 1200 via output 1208.

The inverter includes a set of transistors, or thin-film transistors, 1210 that are designed or positioned to reduce or minimize static leakage current. The set of transistors 1210 may include a pair of pull-down TFTs (seen as TFTs $T_0$ (1210a) and $T_2$ (1210b)) and a pair of diode connected TFTs (seen as TFTs $T_3$ (1210c) and $T_4$ (1210d)). The inverter 1200 also includes a pull-up TFT $T_1$ (1210e) that is connected to the VOD input 1202. The inverter 1200 further includes a capacitor $C_{fb}$ (1212)

In some of the embodiments, the logic gates of the disclosure use a bootstrapped feedback network formed by TFTs $T_1$ (1210e), $T_3$ (1210c), $T_4$ (1210d) and capacitor $C_{fb}$ (1212) to enable full output-swing. At the same time, a path formed by a series of three TFTs connected in series is used to minimize or reduce the static leakage-current which in the current embodiment is TFTs $T_2$ (1210b), $T_3$ (1210c) and $T_4$ (1210d).

Turning back to FIGS. 13a and 13b, examples of operation of the 5T inverter gate 1200 are provided. With respect to FIG. 13a, operation is discussed with respect to positive input transition.

Figures 13A, 13B:
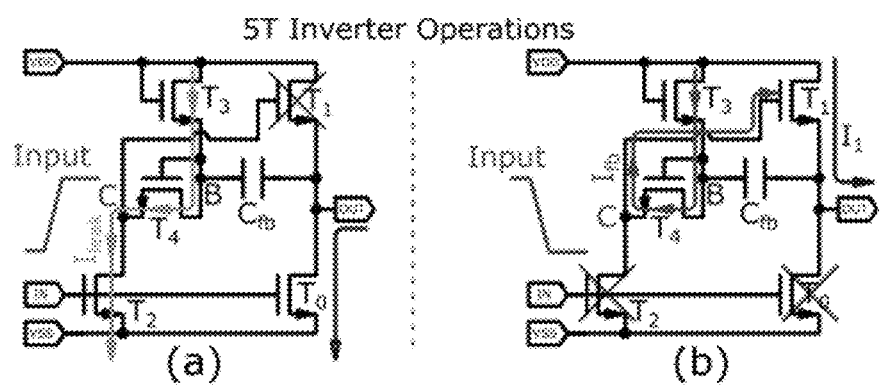
FIG. 13a is a schematic diagram of another embodiment of a 5T inverter during a positive input transition.
FIG. 13b is a schematic diagram of the 5T inverter of FIG. 13a during a negative input transition.

As shown in FIG. 13a, the pull-down TFTs 1210a and 1210b are switched ON, discharging Vout and node C. Meanwhile, a leakage-current path (from TFT 1210c to TFT 1210b) is formed by the two diode-connected TFTs (1210c and 1210d) with TFT 1210b operating in a linear mode. In the steady state, TFTs 1210c and 1210d operate or act as current sources with high drain-source resistance. The leakage-current may be expressed via a gradual-channel approximation of the I-V relationship of $T_2$ shown in Equation 35. The device parameters, such as the field-effect mobility, and threshold-voltage are expressed as µ and $V_t$, respectively, while the specific gate capacitance is given by $C_{dielec}$.

$$I_{leak} = \mu_n C_{dielec} \frac{W_2}{L_2}[(V_{DD} - V_T)V_C - \frac{V_C^2}{2}]$$ Eq. 35

It can be seen from Equation 35 that Ileak is directly proportional to the W/L ratio of TFT 1210b. Therefore, when a width of TFT 1210b is minimized or reduced, the static leakage-current is reduced. If the input is high, TFT 1210b is ON and its drain-source resistance is significantly lower than the resistance of the diode connected TFTs 1210c and 1210d combined. Consequently, the voltage at node C, Vc, approaches ground and pull-up TFT 1210e remains OFF. As a result, Vout is able to reach ground level by discharging through TFT 1210a. At the same time, a voltage level at node B is held at approximately half of VDD due to voltage division on the leakage path. This voltage difference between node B and Vout is held by the capacitor 1212 and provides a boost to node B when the input makes a high-to-low transition.

With respect to a negative input transition, as shown in FIG. 13b, pull-down TFTs 1210a and 1210b are turned OFF, blocking all leakage paths to ground. Since the voltage difference between nodes B and C is approximately ½VDD, current from VDD begins to flow through TFT 1210c into nodes B and C which gradually turns pull-up transistor 1210e ON. This transient current, $I_{fb}(t)$, can be expressed by the I-V relationship of transistor 1210d shown in Equation 36. Here, variable "t" represents the time dependence.

$$I_{fb}(t) = \frac{1}{2}\mu_n C_{dielec}\frac{W_4}{L_4}[V_B(t) - V_C(t) - V_T]^2$$ Eq. 36

As Vout increases after transistor 1210e is turned ON, assuming transistor 1210e operates mostly in saturation mode, its drain-source current $I_1(t)$ can be expressed as:

$$I_1(t) = \frac{1}{2}\mu_n C_{dielec}\frac{W_1}{L_1}[V_C(t) - V_{out}(t) - V_T]^2$$ Eq. 37

As Vout increases, the voltage at node B is also pushed higher by the capacitor 1212. Since the stored voltage difference across the capacitor is approximately ½VDD from the previous phase, the relationship between Vout(t) and Vb(t) is:

$$V_B(t) = V_{out}(t) + \frac{1}{2}V_{DD}$$ Eq. 38

This bootstrapped feedback loop formed by transistors 1210e, 1210c, 1210d and capacitor 1212 leads to VB approximately equalling (3/2) VDD−VT, and Vout=VDD at steady-state. This was tested and analysis of the 5T inverter showed the potential of providing full output-swing and maintaining a low static leakage-current while having fewer TFTs compared to current solutions.

More specifically with respect to FIGS. 13a (positive input transition) and 13b (negative input transition), an x represents that the that the TFT is turned OFF, the line from the output 1208 through TFT 1210a represents current flow to charge or discharge the output. The line through TFT 1210c, TFT 1210d and TFT 1210b represent the leakage-current path and the dash-dot line of FIG. 13b represents the current flow of the bootstrapped feedback loop.

In timing simulation testing of the 5T inverter of FIG. 12a, from circuit analysis, it can be seen that the output pull-up transition is generally slower than the pull-down caused by the decreasing over-drive voltage on pull-up transistor $T_1$ 1210e as Vout rises. Therefore, the low-to-high propagation delay tpLH and output rise-time $t_r$ determines a high, or maximum, operating speed of the inverter. Each of the transistors ($T_1$ (1210e), $T_2$ (1210b), $T_3$ (1210c), and $T_4$ (1210d)) are varied in width from 20 to 200 µm and the capacitance of capacitor $C_{fb}$ is set to be between 2 to 20 pF to demonstrate the individual effect on $t_{pLh}$ and $t_r$, with the results illustrated in FIGS. 14a and 14b. As can be seen in these figures, by increasing the width of transistors ($T_1$ (1210e), $T_3$ (1210c), and $T_4$ (1210d)) and the capacitor 1214, $t_{pLh}$ and $t_r$ are lowered since these components contribute positively to the bootstrapped feedback loop. However, transistor $T_2$ (1210b) behaves in the opposite way. Because $T_2$ is OFF when the input is low, it does not contribute any current to accelerate the feedback, therefore, reducing the width of $T_2$ (1210b) simultaneously lowers the parasitic capacitance and the direct-path current, both of which lead to improved $t_{pLh}$ and $t_r$.

The high-to-low propagation delay ($t_{pLh}$) and output fall-time ($t_f$) are simulated and the results are illustrated in FIGS. 14c and 14d, respectively. The variations of these two values are much lower compared to the pull-up transition due to the over-drive voltage of transistor $T_0$ 1210a which remains constant during the transition. However, the feedback capacitor shows an increase in tf when its size becomes larger. This is due to the fact that transistor $T_0$ 1210a has to drain more charge from $C_{fb}$ that was stored during the negative input transition phase, when $C_{fb}$ is larger. Consequently, the size of the capacitor $C_{fb}$ has to be selected to balance both the pull-up and pull-down transitions. FIG. 14e shows the static leakage-current $I_{leak}$ with respect to the width of all components of the inverter.

As shown in FIG. 14f, the average power consumption increases when all the components are sized up as expected. In addition, the steady-state voltages of $V_b$ and $V_c$ when input is low, are plotted in FIGS. 14g and 14h respectively to demonstrate the voltage boosting that provides the full-swing capability of the 5T inverter.

Figure 15:
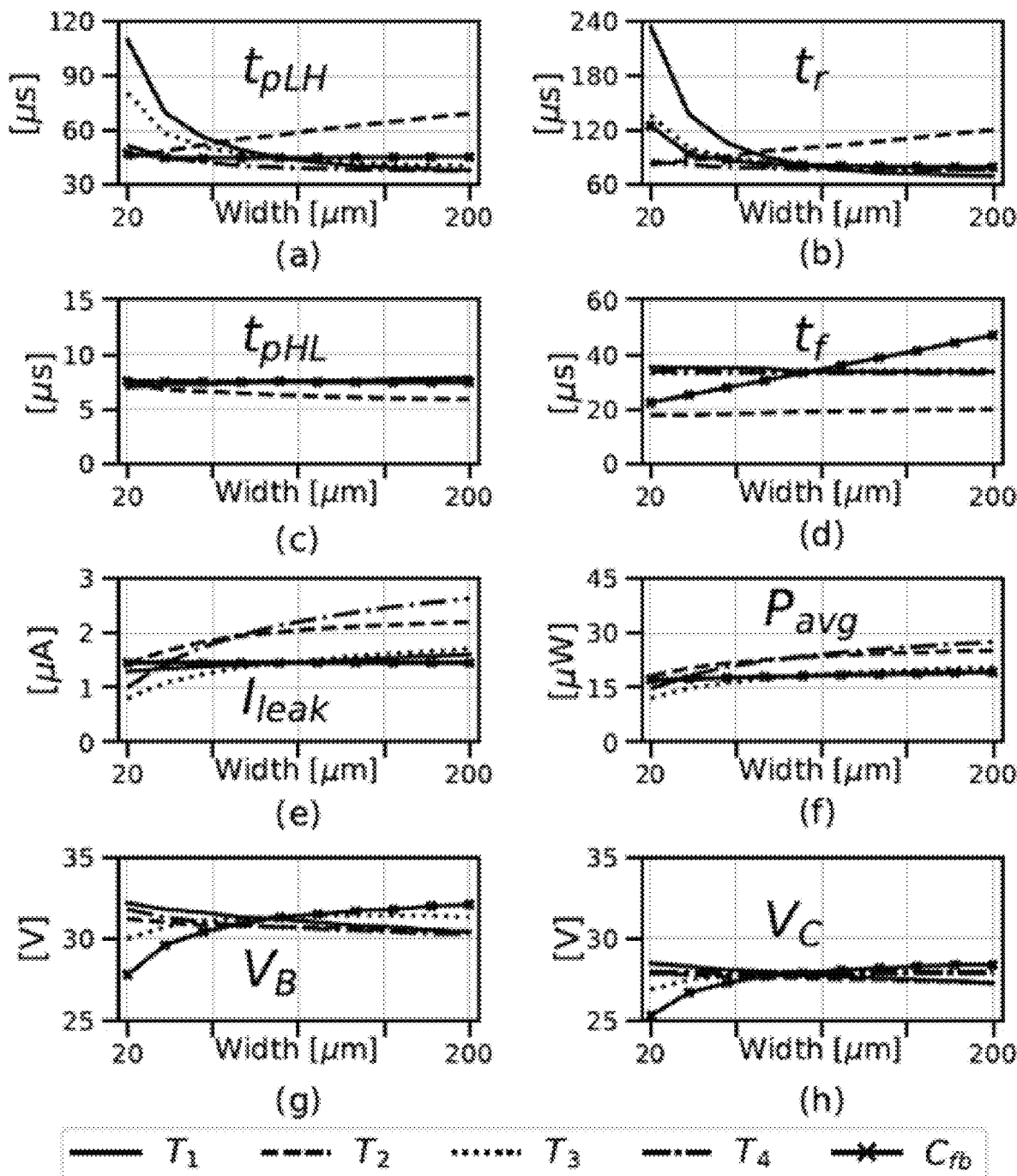
FIG. 15 is a set of graphs showing characteristics of a 5T Inverter in accordance to the disclosure.

Due to the role of transistor $T_2$ 1210b in controlling the leakage current and $V_c$, it is necessary to inspect the response of total static leakage current, the leakage current of transistor $T_1$ 1210e and $V_c$ when input is high with respect to the width of transistor $T_2$ 1210b. Simulation results of these factors are shown in FIG. 15. It is observed that the main leakage path involving transistors $T_2$ 1210b, $T_3$ 1210c and $T_4$ 1210d contribute to more than 90% of the total leakage current while transistor $T_1$ 1210e only accounts for a small fraction. Moreover, when the width of transistor $T_2$ 1210b increases, total leakage current also rises which matches the theoretical analysis outlined in Equation 35. This is due to the fact that transistor $T_2$ 1210b operates in the linear region when the input signal is high, such that an increase of the channel width leads to a higher static leakage-current which is undesirable. On the other hand, if $V_c$ is higher when the inverter enters the negative input transition, the transient behavior of the output signal ($t_{plh}$ and $t_r$) is improved. This is due to the feedback network having a higher starting voltage, so that it requires less time to reach full output voltage. This impact of transistor $T_2$ 1210b on ($t_{plh}$ and $t_r$) is clearly demonstrated in FIGS. 14a and 14b. Therefore, the width of transistor $T_2$ 1210b should be minimized, or kept low, to maintain a low static leakage current and fast pull-up transition time.

In a specific embodiment, the widths of the transistors and the capacitor in the 5T inverter may be as follows:

|  | $T_0$ | $T_1$ | $T_2$ | $T_3$ | $T_4$ | $C_{fb}$ |
| --- | --- | --- | --- | --- | --- | --- |
| Width (μm) | 100 | 100 | 20 | 100 | 40 | 10 pF |

Similar calculations may be made to determine preferred widths of for other logic gates in accordance with the disclosure, such as the NAND and NOR gates discussed below.

Figure 16A:
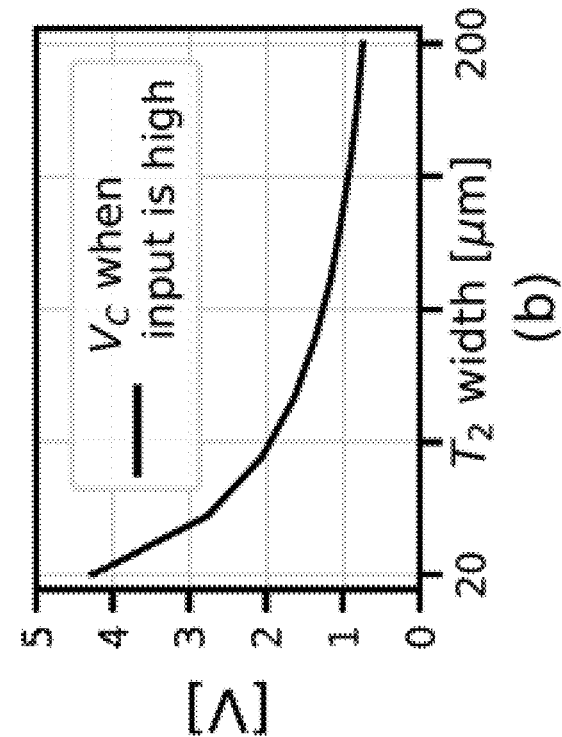
FIG. 16a is a set of graphs showing leakage current and Vc.
Figure 16A:
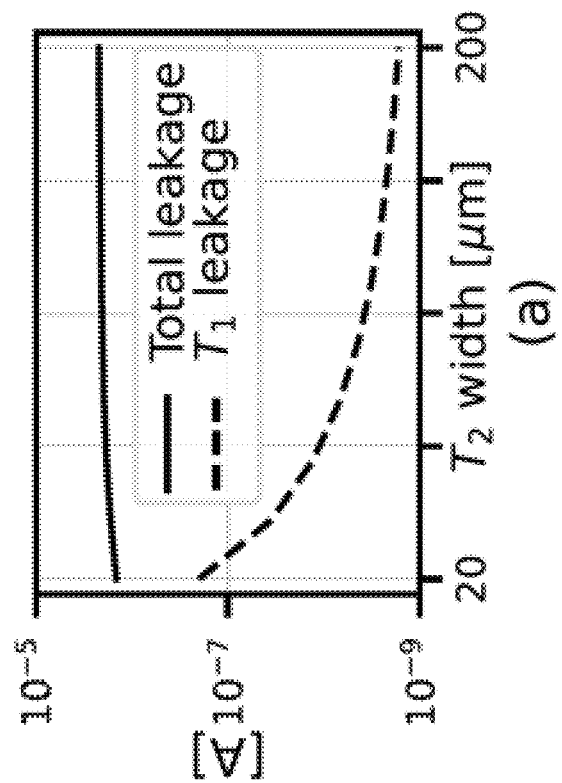
Figure 16B:
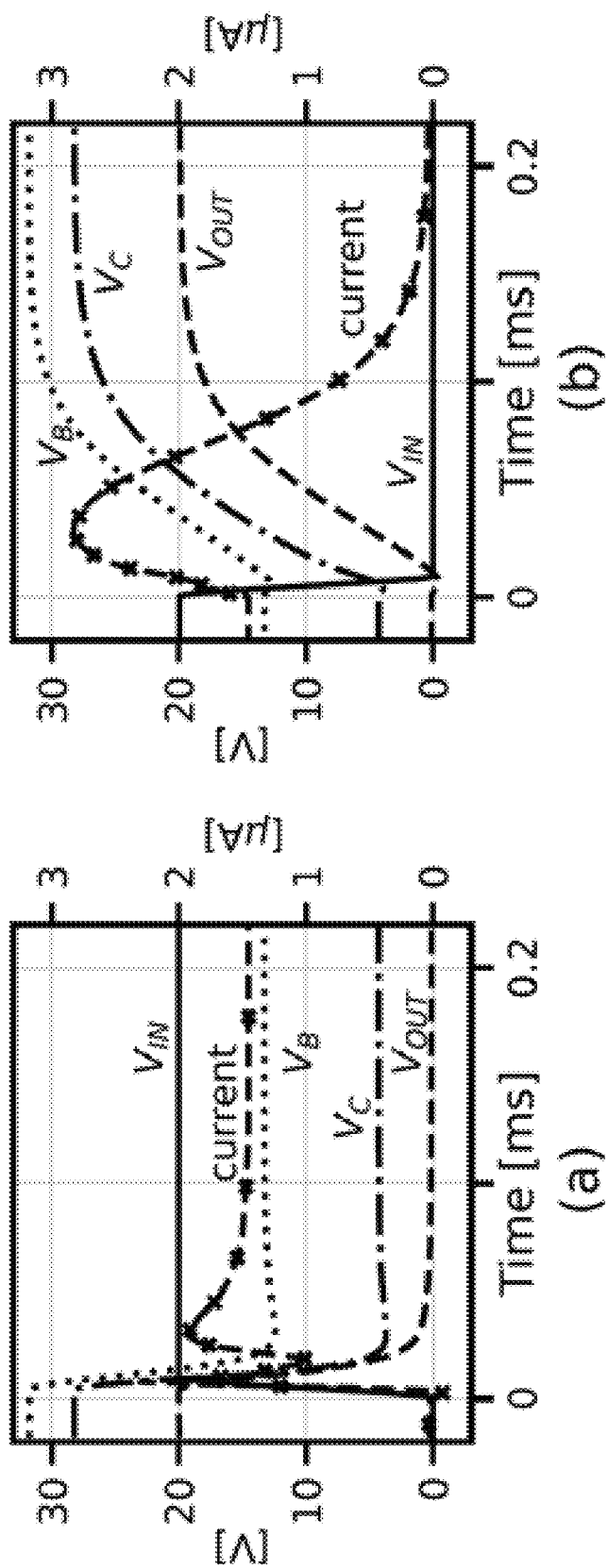
FIG. 16b is a set of graphs showing transient waveforms of the 5T inverter during output pull-down and output pull-up transitions.

In experimentation for an inverter with the widths outlined above, transient behaviour of the inverter was simulated. All voltages reached expected values after settling to steady-state and the static leakage current was significantly lower than current inverters. This is shown in FIG. 16a. FIG. 16b shows transient waveforms of the 5T inverter during output pull-down and output pull-up transitions.

Turning to FIG. 12b, a schematic diagram of a 7T NAND gate is shown. The 7T NAND gate 1230 receives a set of inputs including a VOD input 1232, a first input (INB) 1234, a second input (INA) 1236 and a Vss input 1238 which may be seen as voltages that are applied to or transmitted through the inverter NAND gate 1230 and then out of the NAND gate 1230 via output 1240.

The NAND gate 1230 includes a set of transistors, or thin-film transistors, 1242 that are designed or positioned to reduce or minimize static leakage current. Similar to the embodiment of the 5T inverter, the set of transistors 1242 may include a pair of pull-down TFTs (seen as TFTs $T_0$ (1242a) and $T_2$ (1242b)) and a pair of diode connected TFTs (seen as TFTs $T_3$ (1242c) and $T_4$ (1242d)). The NAND gate 1230 also includes a pull-up TFT $T_1$ 1242e that is connected to the VOD input 1202. Two other transistors $T_5$ 1242f and $T_6$ 1242g (which may be seen as NAND components) are connected in series to the input INB 1234 with transistor $T_5$ 1242f connected between transistors $T_4$ 1242d and $T_2$ 1242b and transistor $T_6$ connected between the transistor $T_1$ 1242e and transistor $T_0$ 1242a.

The NAND gate 1230 further includes a capacitor $C_{fb}$ (1244)

Turning to FIG. 12c, a schematic diagram of a 7T NOR gate is shown. The 7T NOR gate 1250 is similar in structure to the NAND gate of FIG. 12b with a different placement of some of the transistors, namely the pull-down transistors $T_2$ (1242b) and $T_0$ (1242a).

In one aspect of the disclosure, there is a need to determine a geometry of the set of TFTs for each specific logic gate. In one embodiment, this may be determined via simulations where a precise device model is used as a foundation for the device.

Figure 17:
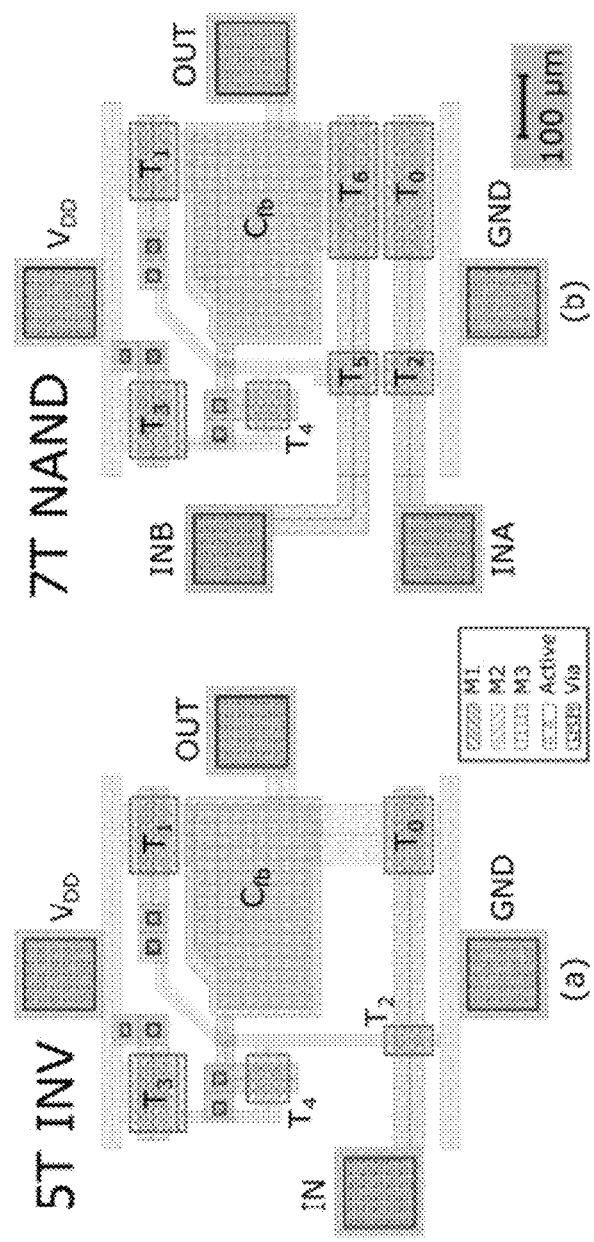
FIG. 17 are a pair of schematic layouts of a 5T inverter gate and a 7T NAND gate.

In a further embodiment of the disclosure, the logic gates may be implemented or fabricated on a flexible polyethylene napthalate (PEN) substrate. In one embodiment, this is due to the design and placement of the components making up the logic gates. FIG. 17 provides schematic layouts of the 5T inverter (FIG. 17a) and the 7T NAND gate (FIG. 17b). As logic gates may be implemented in high-density logic circuit, in one embodiment, the TFTs are placed in a same orientation while the capacitor is shaped to improve areal utilization. In this manner, the capacitor may be irregularly shaped. The power and ground rails may be placed at the top and bottom of the logic gate for ease of sharing between different components of the logic gates.

The substrate includes three metal layers (M1-M3) and a via layer with layer M1 used for internal routing within a logic gate, layer M2 used for horizontal interconnects and layer M3 used for vertical interconnects.

In one embodiment, the disclosure is directed at the integration of logic into a flexible substrate to control long-term electrical stability of devices and circuits as well as the performance of the same. When a bending direction of the flexible substrate is parallel to the current flow, i.e., the TFT channel length direction, the impact of bending is at the highest, especially to the long-term gate-bias induced electrical instability. When the bending direction of the flexible substrate is perpendicular to the current flow, the impact of mechanical strain is relatively less.

Figure 20:
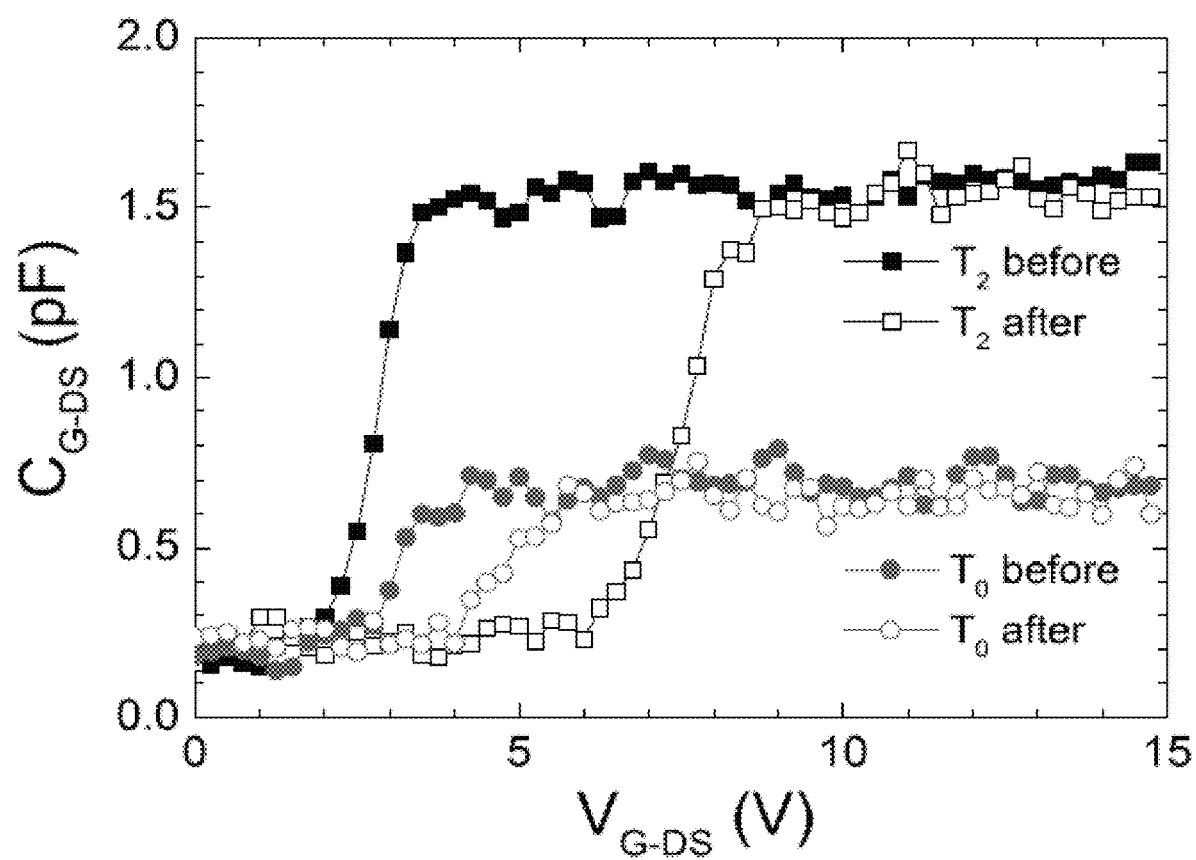
FIG. 20 is a graph showing capacitance-voltage measurements of two transistors in a logic gate.

As such, the layout of the pixel circuit should be given special consideration such that the correlating TFTs within each logic gate are in the same orientation and placed in proximity. In this way, the TFTs experience the same mechanical strain so that their relative degradation is similar. In other situations, the TFT orientation may be perpendicular to each other so that one transistor or component in the logic gate may change differently compared to the other while under mechanical strain. In this case, the components in the logic gate behave differently even when operating under the same bias conditions. This effect may be used to enhance the performance of one circuit component (or transistor) while maintaining the same electrical signals that drive the logic gate. In experimentation, an applied mechanical strain caused the TFTs in the circuit to experience 3% increase and a 4% decrease in drive current under tensile and compressive strain, respectively. By positioning the TFT layout to take advantages of these strain states, the TFT performance is modified to affect the logic gate response. FIG. 20 shows capacitance-voltage measurements of two transistors in a logic gate measured before and after dc gate-bias with applied mechanical strain under different orientations. The pull-down transistors TFTs are parallel and perpendicular, respectively, to the applied mechanical strain. The threshold voltage shift of $T_2$ (~5 V, shown by the line with solid squares) is shown to be larger than that of $T_0$ (~2V, shown by the line with solid circles), demonstrating the orientation dependence and the effect of the mechanical strain on the electrical stability of the TFTs.

With respect to the fabricated three-to-eight decoder discussed above, under flat, tensile, and compressive strain states after continuous operation for 24 h, it was determined that the decoder maintained functionally correct and full-swing output signals toggling at 1.6 kHz, which is equivalent to a 50-row display refreshing at 30 Hz when the TFTs were flat.

The effect of the mechanical strain on a flexible multi-stage logic circuit performance is shown through the rise time ($t_r$) fall time ($t_f$), and the propagation delay ($t_{pLH}$) of the decoder circuit. Variations of ~±3.5% (compared to mechanically flat circuits) under applied bending strain was achieved (as outlined in Table 1).

This variation may be amplified, reduced or minimized through the layout of the TFT in the logic gate and their orientation relative to the applied mechanical bending. These effects are due to the deterioration of the weak Si—Si bonds in the amourpous Si TFTs that affect the carrier transport of the device when under mechanical strain.

TABLE 1

COMPARISON OF THE AVERAGE $t_{pLH}$, $t_r$, $t_{pHL}$, AND $t_f$ OF THE THREE-TO-EIGHT DECODER UNDER TENSILE AND COMPRESSIVE STRAIN CONDITIONS

|  | $t_{pLH}$ | $t_r$ | $t_{pHL}$ | $t_f$ |
|---|---|---|---|---|
| Tensile | −3.3% | −2.9% | −3.5% | −3.1% |
| Compressive | +2.9% | +3.0% | +3.3% | +3.2% |

The dependence of the circuit operation on the orientation and geometry of the TFTs during applied mechanical strain does provide a more adaptable methodology for designing TFT-based circuits for flexible electronics, adding an additional degree of freedom to control the device parameters and the overall circuit response and its performance.

Figure 12D:
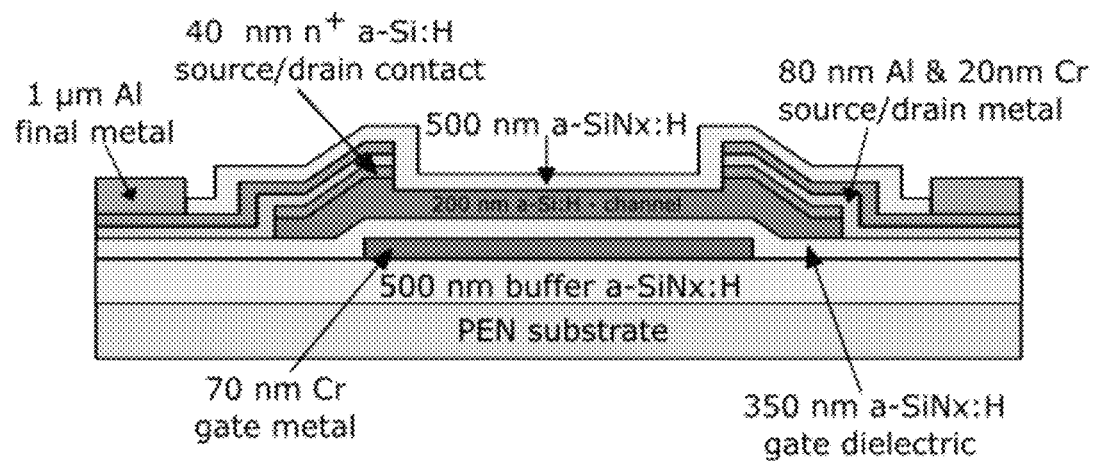
FIG. 12d is a cross-section of a Thin Film Transistor in accordance with the disclosure fabricated on a flexible substrate.

In one embodiment, the decoder circuit was fabricated on a flexible PEN substrate using an industry-standard fix-mask a-Si:H TFT process with a minimum or low feature size of 20 μm which limited a size of the TFT channel length and width to be 20 μm. A cross-sectional view is schematically shown in FIG. 12d.

A high or maximum deposition temperature in the plasma-enhanced chemical-vapor deposition (PECVD) chamber was set at 150° C. for the a-Si:H channel and a-SiNx:H gate dielectric layers to comply with the thermal budget of the PEN substrate. If the deposition temperatures were higher than 170° C., the PEN wafers may deform causing mis-alignment of the TFT device layers.

Figure 12E:
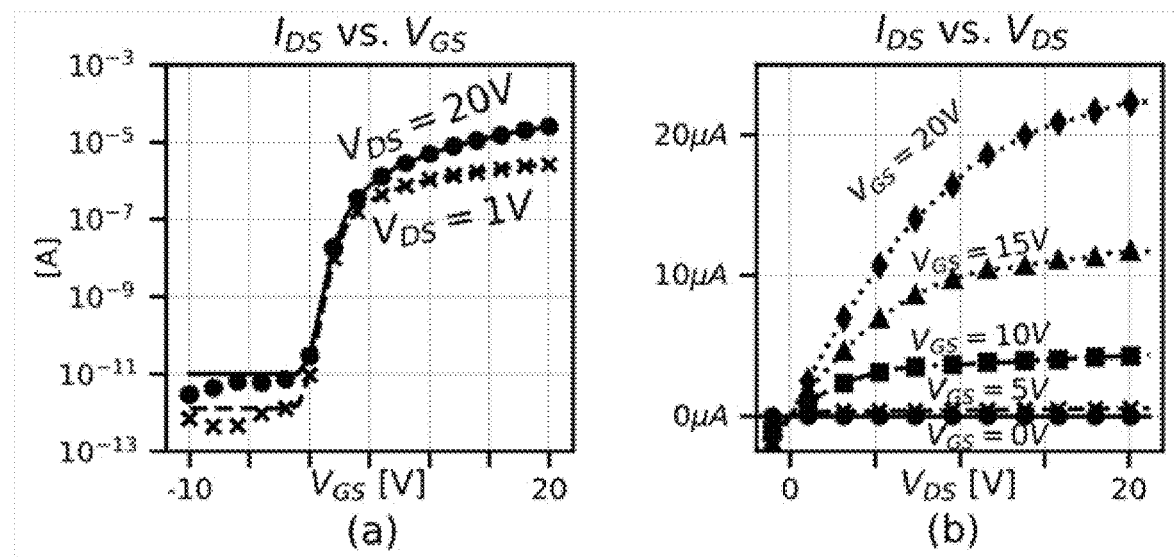
FIG. 12e are graphs showing transfer and output curves of Thin Film Transistor.

The $I_{DS}$ vs. $V_{gs}$ and $I_{DS}$ vs. $V_{ds}$ curves were measured through two different
pulsed Keithley source meters. After device parameter fitting and optimization using a modified level-61 a-Si:H TFT model, the simulated and measured I-V curves are shown in FIG. 12e. The device simulation has demonstrated close matching to the measurements. The field-effect mobility, threshold voltage, and sub-threshold slope values are extracted to be 1.05 cm²/Vs, 3.1V, and 0.62 V/decade, respectively.

Using the logic gates of FIGS. 12a to 12c, enhanced functionality for these logic gates can be integrated on a flexible substrate due in part to the positioning of the components making up each logic gate. In one embodiment, implementation of the logic gates on the PEN substrate resulted in the manufacture of a 3-to-8 decoder circuit which may be used independently or in conjunction with one of the display architectures disclosed above.

In one embodiment, the decoder circuit can be used as the row-select driver to reduce the number of bonding pads required to connect the flexible substrate to external signal drivers. Since large-area flexible electronics have applications for displays or image sensors, the role of the decoders is a factor in operation of these displays. For instance, a N*M display array has N row-select pads. However, if a decoder is used, the number of pads may be reduced to log [n/2]+1. Further advantage is realized when the array resolution is higher since the physical dimension of the bonding pads does not scale well with the current technologies.

Figure 18:
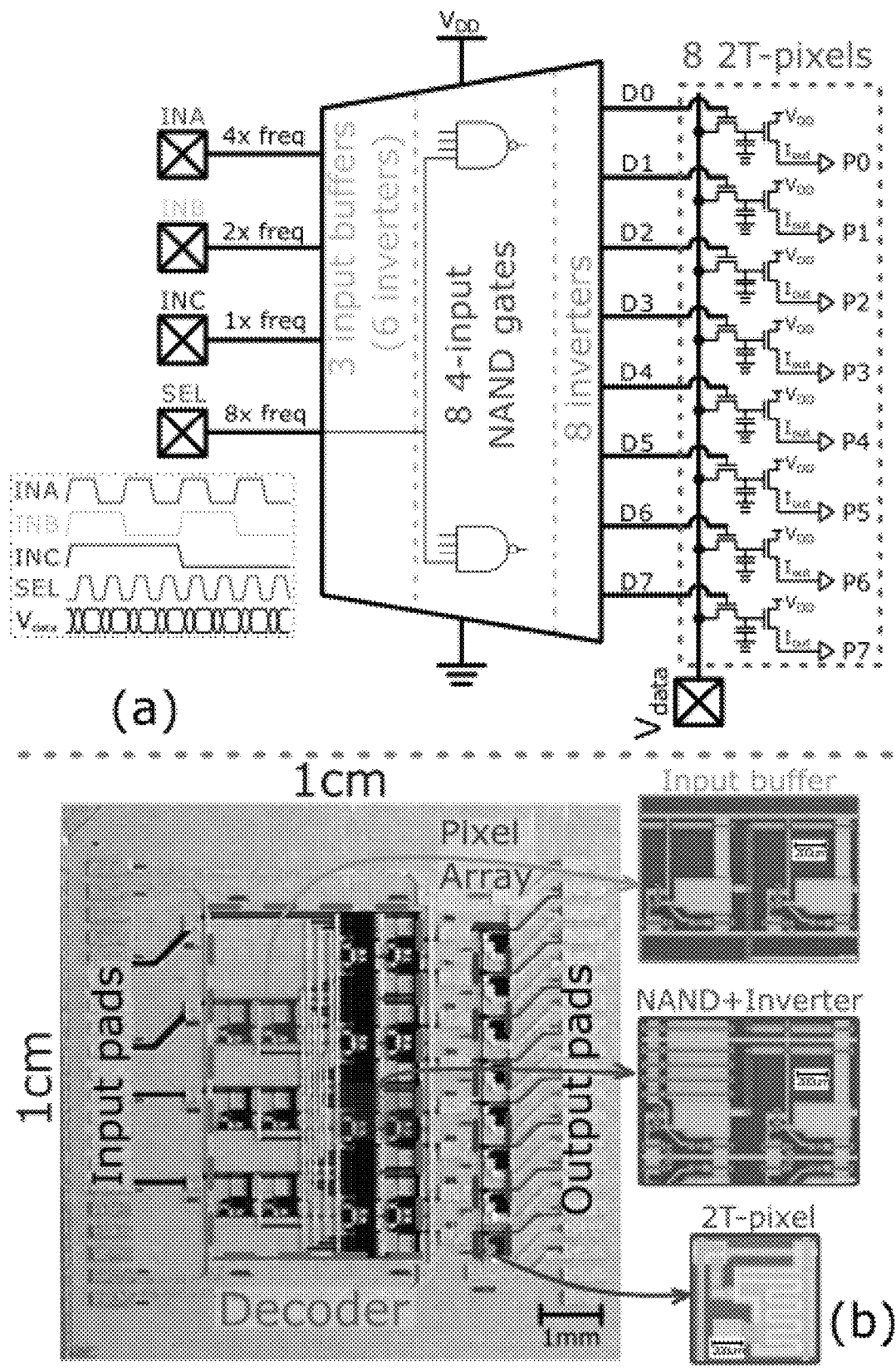
FIG. 18 is a photograph of a decoder circuit on a flexible substrate.

In experimentation, a column of 2-TFT (2T) pixel circuits was attached to the 3-to-8 decoder to verify the decoding operation. A schematic diagram and input signal waveform of the 3-to-8 decoder with the pixel column is shown in FIG. 18a and an optical micro-graph of the circuit is shown in FIG. 18b. In one embodiment, the overall die-size is 1 cm×1 cm.

In one specific embodiment, the decoder circuit includes fourteen 5T inverters and eight 4-input NAND gates totalling 158 TFTs which occupy an area of 3.6 mm×6.1 mm. The four input signals (INA, INB, INC, and SEL) and the data voltage of the pixel column Vdata were generated as discussed above with respect to FIG. 12a. The input buffer stage contains six inverters which provide complementary and buffered input signals required by the NAND gates with the SEL signal provided by an external integrated circuit (IC) driver directly and is connected to the lowest input of the NAND gate (as shown in FIG. 18a and set to the highest operating frequency which is 8 times the slowest input (INC).

The SEL signal has two roles in operation of the decoder circuit. First, since a-Si:H TFTs have low switching speed, the complementary and buffered input signals do not reconverge at the inputs of the NAND gates at the same time. Therefore, the SEL signal acts as a gating element to prevent or reduce the likelihood or any glitch in the outputs of the decoder circuit. Secondly, due to the bias-induced threshold-voltage degradation of a-Si:H TFTs, the input buffers may deteriorate over-time, causing glitches to reappear after long periods of continuous operation. Therefore, a delay-matching technique may be applied on the SEL signal to provide cross-talk free operation over-time which is beneficial for sensor or display arrays.

Performance of the flexible decoder circuit was characterized under flat (no mechanical bending) and mechanically strained conditions. Using curved sample holders on which the flexible substrate was taped, tensile and compressive strain conditions could be realized. In this example, the PEN substrate had a 125 μm thickness and the radius of curvature for the sample holders was 4 cm with a strain $\varepsilon$=about 0.31%. The measured IDS of a discrete TFT was about 3% higher in tension and about 4% lower in compression compared to a flat TFT, which is due to changes in the field-effect mobility of the TFTs under mechanical strain. When the strain is applied to the decoder circuit, slight variations on the rise/fall time and propagation delay were also observed.

Figure 19:
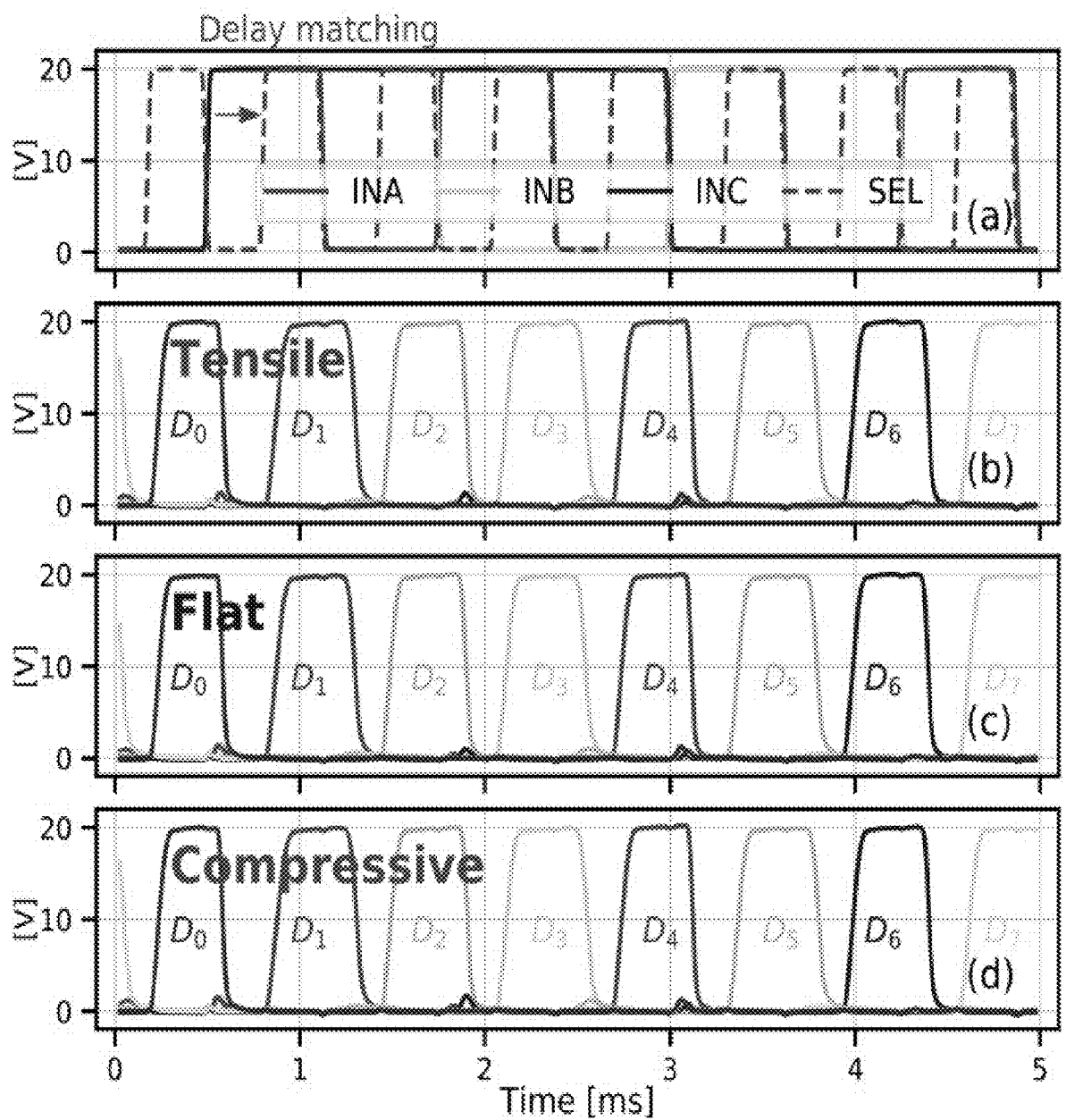
FIG. 19 are graphs showing the operational outputs of the decoder circuit under different operational conditions.

FIG. 19 shows the measurement results of the fabricated 3-to-8 decoder under flat, tensile and compressive strain states after continuous operation for 24 hours. It was determined that the decoder circuit fabricated with the logic gates of FIGS. 12 ta to 12c, was able to maintain functionally correct and full-swing output signals toggling at 1.6 kHz, which is equivalent to a 50-row display refreshing at 30 Hz. As shown in FIG. 19a, the delay-matching of the SEL signal was set to 280 μs with respect to other signals (INA, INB, and INC) to eliminate or reduce the glitches and accommodate the threshold-voltage degradation due to long-term electrical stress.

Embodiments herein involve dividing the data information to segments and driving each section individually. This is intended to allow for decreasing the dynamic power consumption by using more than one driver for each display media (LED, OLED, etc.). This can also allow for decreasing the clock frequency by using more than one driver for each display media. Alternatively, this technique can allow for increasing the refresh rate, color depth, and resolution with the use of more than one driver for each display media. Embodiments herein also involve a charge sharing technique to create any required voltage in the display with reduced circuitry or without extra circuitry. This can allow for decreasing the power consumption in row drivers via an energy recycling concept. Further, low power drivers can be provided by an energy recycling technique via exploiting a capacitive bank.

Embodiments herein target low-power portable display devices, but can also be compatible with other displays as low power consumption is important for energy conservation as well as displays needing high resolution or high refresh rate.

In the preceding description, for purposes of explanation, numerous details are set forth in order to provide a thorough understanding of the embodiments. However, it will be apparent to one skilled in the art that these specific details may not be required. In other instances, well-known structures may be shown in block diagram form in order not to obscure the understanding. For example, specific details are not provided as to whether aspects of the embodiments described herein are implemented as a software routine, hardware circuit, firmware, or a combination thereof.

Embodiments of the disclosure or portions/aspects thereof may be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The above-described embodiments are intended to be examples only. Alterations, modifications and variations can be effected to the particular embodiments by those of skill in the art without departing from the scope, which is defined solely by the claims appended hereto.

We claim:

1. A CMOS-like logic gate comprising:
a set of thin-film-transistors (TFTs), the set of TFTs including a subset of pull down TFTs, a subset of diode-connected TFTs and an output pull-up transistor; and
a capacitor;
wherein the subset of diode-connected TFTs, the output pull-up transistor and the capacitor are positioned to provide a bootstrapped feedback network to provide full-output swing; and
wherein the subset of diode-connected TFTs and one of the subset of pull-down TFTs form a leakage current path; and
wherein at least one of the subset of pull-down TFTs is connected to a first input.

2. The CMOS-like logic gate of claim 1 wherein a width of the pull-down TFT in the leakage current path is less than a width of the other TFTs in the set of TFTs to reduce static leakage current.

3. The CMOS-like logic gate of claim 1 wherein the capacitor is positioned between the set of diode-connected TFTs and a signal output.

4. The CMOS-like logic gate of claim 1 wherein the subset of pull-down TFTs are connected to a signal input.

5. The CMOS-like logic gate of claim 1 wherein the subset of diode-connected TFTs is connected to a voltage input.

6. The CMOS-like logic gate of claim 1 further comprising:
a NAND gate set of TFTs connected to a second input.

7. The CMOS-like logic gate of claim 6 wherein the NAND gate set of TFTs are located in series between the subset of diode-connected TFTs and the subset of pull-down TFTs.

8. The CMOS-like logic gate of claim 1 further comprising:
a NOR gate set of TFTs connected to a second input.

9. The CMOS-like logic gate of claim 8 wherein the NOR gate set of TFTs are located in parallel with the subset of pull-down TFTs.

10. The CMOS-like logic gate of claim 1 wherein the other of the pull-down TFTs is connected to an output.

11. The CMOS-like logic gate of claim 10 wherein the output pull-up TFT is connected to the output.

12. A flexible substrate for use in displays comprising:
a set of logic gates, each logic gate comprising:
   a set of thin-film-transistors (TFTs), the set of TFTs including a subset of pull-down TFTs, a subset of diode-connected TFTs and an output pull-up transistor; and
   a capacitor;
   wherein the subset of diode-connected TFTs, the output pull-up transistor and the capacitor are positioned to provide a bootstrapped feedback network to provide full-output swing; and
   wherein the subset of diode-connected TFTs and one of the subset of pull-down TFTs form a leakage current path;
   wherein at least one of the subset of pull-down TFTs is connected to a first input; and
   wherein the subset of pull-down transistors are positioned to be parallel or perpendicular to a bending direction of the flexible substrate.

13. The flexible substrate of claim 12 further comprising:
a set of metal layers, the set of metal layers including an via layer for internal routing within the set of logic gates, a horizontal interconnects layer and a vertical interconnects layer.

* * * * *